(12) United States Patent
Okawa et al.

(10) Patent No.: US 11,715,795 B2
(45) Date of Patent: Aug. 1, 2023

(54) SEMICONDUCTOR DEVICE

(71) Applicant: Nuvoton Technology Corporation Japan, Nagaokakyo (JP)

(72) Inventors: Ryosuke Okawa, Nara (JP); Toshikazu Imai, Hyogo (JP); Kazuma Yoshida, Kyoto (JP); Tsubasa Inoue, Osaka (JP); Takeshi Imamura, Kyoto (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 165 days.

(21) Appl. No.: 17/494,565

(22) Filed: Oct. 5, 2021

(65) Prior Publication Data
US 2022/0029016 A1    Jan. 27, 2022

Related U.S. Application Data

(63) Continuation of application No. 16/986,810, filed on Aug. 6, 2020, now Pat. No. 11,171,234, which is a
(Continued)

(51) Int. Cl.
*H01L 29/78* (2006.01)
*H01L 23/538* (2006.01)
*H01L 27/088* (2006.01)

(52) U.S. Cl.
CPC ...... *H01L 29/7827* (2013.01); *H01L 23/5386* (2013.01); *H01L 27/088* (2013.01)

(58) Field of Classification Search
CPC ............... H01L 29/7827; H01L 29/088; H01L 23/5386
See application file for complete search history.

(56) References Cited

U.S. PATENT DOCUMENTS 11,171,234 B2 *  11/2021  Okawa ............... H01L 29/7813
2006/0263988 A1   11/2006  Takahashi et al.
(Continued)

FOREIGN PATENT DOCUMENTS

JP      2013-247309 A    12/2013
JP      2015-095550 A     5/2015
(Continued)

OTHER PUBLICATIONS

International Search Report dated Mar. 3, 2020 in International Application No. PCT/JP2019/048561; with English translation.
(Continued)

*Primary Examiner* — Mark V Prenty
(74) *Attorney, Agent, or Firm* — McDermott Will & Emery LLP

(57) ABSTRACT

A semiconductor device includes a first transistor disposed in a first region of a semiconductor layer and a second transistor disposed in a second region of the semiconductor layer, and includes, on the surface of the semiconductor layer, first source pads, a first gate pad, second source pads, and a second gate pad. In the plan view of the semiconductor layer, the first and second transistors are aligned in a first direction; the first gate pad is disposed such that none of the first source pads is disposed between the first gate pad and a side parallel to the first direction and located closest to the first gate pad; and the second gate pad is disposed such that none of the second source pads is disposed between the second gate pad and a side parallel to the first direction and located closest to the second gate pad.

10 Claims, 22 Drawing Sheets

Related U.S. Application Data continuation of application No. PCT/JP2019/048561, filed on Dec. 11, 2019.

(60) Provisional application No. 62/782,180, filed on Dec. 19, 2018.

(56) References Cited

U.S. PATENT DOCUMENTS

| | | |
|---|---|---|
| 2013/0320454 A1 | 12/2013 | Suzuki et al. |
| 2015/0129958 A1 | 5/2015 | Nita et al. |
| 2019/0229194 A1 | 7/2019 | Yoshida et al. |
| 2019/0319126 A1 | 10/2019 | Matsushima et al. |
| 2020/0395479 A1 | 12/2020 | Fujioka et al. |

FOREIGN PATENT DOCUMENTS

| | | |
|---|---|---|
| JP | 2016-086006 A | 5/2016 |
| JP | 2019-129308 A | 8/2019 |
| TW | I678773 B | 12/2019 |
| WO | 2016/203764 A1 | 12/2016 |
| WO | 2018/123799 A1 | 7/2018 |

OTHER PUBLICATIONS

Written Opinion of the International Searching Authority dated Mar. 3, 2020 in International Application No. PCT/JP2019/048561; with English translation.

Office Action with Search Report dated Nov. 30, 2020 in the corresponding Taiwanese Patent Application No. 108145375.

Non-Final Office Action issued in U.S. Appl. No. 16/986,810, dated Jan. 11, 2021.

Final Office Action issued in U.S. Appl. No. 16/986,810, dated Apr. 28, 2021.

Notice of Allowance issued in U.S. Appl. No. 16/986,810, dated Jul. 6, 2021.

\* cited by examiner

SEMICONDUCTOR DEVICE

CROSS REFERENCE TO RELATED APPLICATIONS

This application is a Continuation of U.S. patent application Ser. No. 16/986,810, filed on Aug. 6, 2020, which is a U.S. continuation application of PCT International Patent Application Number PCT/JP2019/048561 filed on Dec. 11, 2019, claiming the benefit of priority of U.S. Provisional Patent Application Ser. No. 62/782,180 filed on Dec. 19, 2018, the entire contents of which are hereby incorporated by reference.

BACKGROUND

1. Technical Field

The present disclosure relates to semiconductor devices and in particular to chip-size-package-type semiconductor devices that are facedown mountable.

2. Description of the Related Art

A conventional semiconductor device is known which is mounted on a mounting substrate and switches between a conduction state and a non-conduction state of a current channel on the mounting substrate (see Japanese Unexamined Patent Application Publication No. 2019-129308, for example).

SUMMARY

In general, a current channel along which a large amount of current flows through a mounting substrate is designed so that conduction resistance is lowered. Therefore, there is a demand for a conventional semiconductor device as described above to have characteristics appropriate for reducing conduction resistance in a current channel.

In view of this, an object of the present disclosure is to provide a semiconductor device having characteristics appropriate for reducing conduction resistance in a current channel on a mounting substrate on which the semiconductor device is mounted.

A semiconductor device according to the present disclosure is a chip-size-package-type semiconductor device that is facedown mountable and includes: a semiconductor layer; a metal layer disposed in contact with the bottom surface of the semiconductor layer; a first vertical metal oxide semiconductor (MOS) transistor disposed in a first region of the semiconductor layer; and a second vertical MOS transistor disposed in a second region of the semiconductor layer. The second region is adjacent to the first region in a plan view of the semiconductor layer. The semiconductor layer includes a semiconductor substrate. On the surface of the semiconductor layer, the first vertical MOS transistor includes first source pads and a first gate pad, and the second vertical MOS transistor includes second source pads and a second gate pad. The first source pads, the first gate pad, the second source pads, and the second gate pad are joined to a mounting substrate during facedown mounting. The semiconductor substrate functions as a common drain region shared between the first vertical MOS transistor and the second vertical MOS transistor. In the plan view: the semiconductor layer is rectangular in shape; the first vertical MOS transistor and the second vertical MOS transistor are aligned in a first direction in which a principal current flows; the first gate pad is disposed such that none of the first source pads is disposed (i) between the first gate pad and a first side that is parallel to the first direction and located closest to the first gate pad among four sides of the semiconductor layer and (ii) between the first gate pad and a boundary in the first direction between the first region and the second region; and the second gate pad is disposed such that none of the second source pads is disposed (i) between the second gate pad and a second side that is parallel to the first direction and located closest to the second gate pad among the four sides of the semiconductor layer and (ii) between the second gate pad and the boundary in the first direction.

With the semiconductor device according to one aspect of the present disclosure, it is possible to provide a semiconductor device having characteristics appropriate for reducing conduction resistance in a current channel on a mounting substrate on which the semiconductor device is mounted.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENT

The following embodiment is a specific example of the present disclosure. The numerical values, shapes, materials, elements, arrangement and connection configuration of the elements, etc., described in the following embodiment are merely examples, and are not intended to limit the present disclosure.

In the present disclosure, the terminology "A and B are electrically connected" includes configurations in which A and B are directly connected via wiring, configurations in which A and B are directly connected without wiring, and configurations in which A and B are indirectly connected via a resistive component (resistor element or resistive wire).

EMBODIMENT

[1. Structure of Semiconductor Device]

Hereinafter, the structure of a semiconductor device according to an embodiment will be described. The semiconductor device according to the embodiment is a face-down mountable, chip-size-package (CSP) type semiconductor device including two vertical metal oxide semiconductor (MOS) transistors formed on a semiconductor substrate. The two vertical MOS transistors are each a power transistor and what is called a trench MOS field effect transistor (FET).

Figure 1:
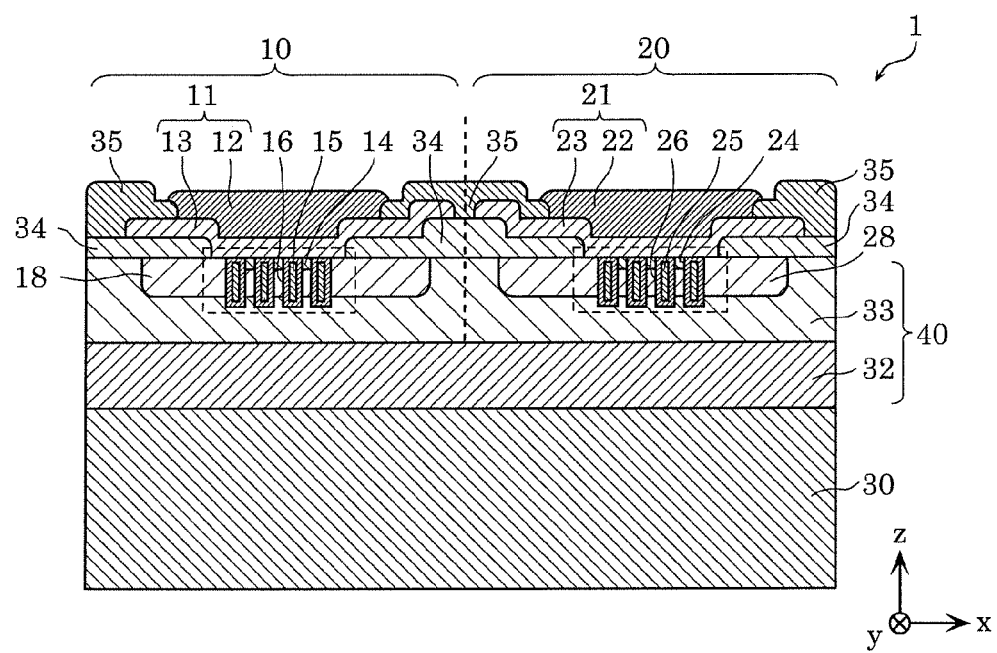
FIG. 1 is a cross-sectional view illustrating one example of the structure of a semiconductor device according to an embodiment.
Figure 2A:
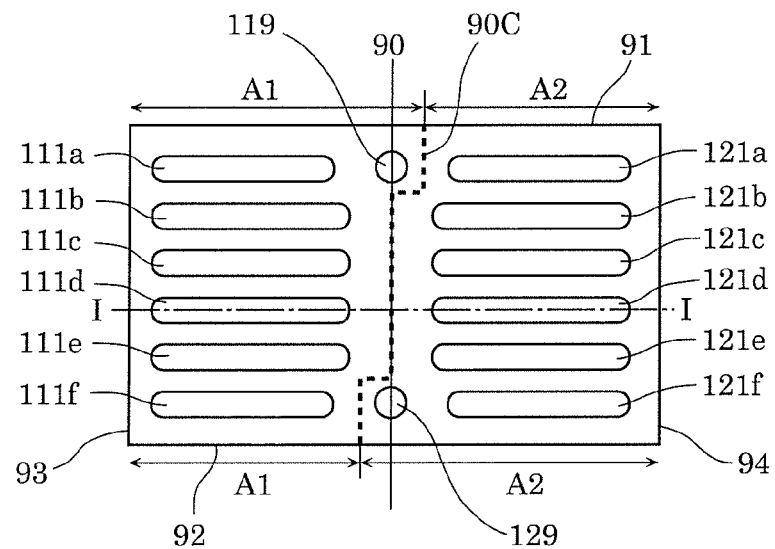
FIG. 2A is a plan view illustrating one example of an electrode pads configuration of a semiconductor device according to the embodiment.
Figure 2B:
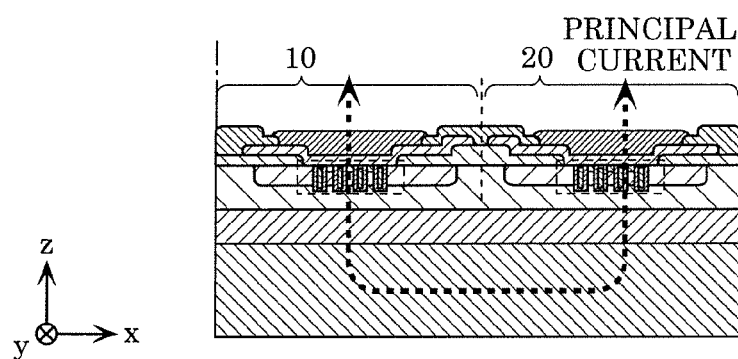
FIG. 2B is a cross-sectional view illustrating a principal current that flows through the semiconductor device according to the embodiment.

FIG. 1 is a cross-sectional view illustrating one example of the structure of semiconductor device 1 according to the embodiment. FIG. 2A is a plan view illustrating one example of an electrode pads configuration of semiconductor device 1 according to the embodiment. FIG. 2B is a cross-sectional view illustrating a principal current that flows through semiconductor device 1. The principal current consists of the principal components of current flowing through a circuit, flows along a current channel in a direction designed for current to flow, and thus excludes a leak current and a surge current. As will be described later, the principal current is referred to as current that flows along a channel indicated by a bidirectional arrow in FIG. 2B when the flow is observed inside semiconductor device 1, and is referred to as current that flows through semiconductor device 1 in a horizontal direction (i.e., current flowing through metal layer 30 or semiconductor substrate 32 in a horizontal direction in FIG. 2B) when semiconductor device 1 is seen in a plan view. Referring to FIG. 4B, which will be described later, the principal current is current that flows from left to right or right to left when printed wiring board 50 including semiconductor device 1 mounted thereon and wiring patterns 51 through 53 are seen in a plan view. FIG. 1 and FIG. 2B each illustrate a cross section taken along line I-I in FIG. 2A.

As illustrated in FIG. 1 and FIG. 2A, semiconductor device 1 includes semiconductor layer 40, metal layer 30, first vertical MOS transistor 10 (hereinafter also referred to as "transistor 10") formed in first region A1 of semiconductor layer 40, and second vertical MOS transistor 20 (hereinafter also referred to as "transistor 20") formed in second region A2 of semiconductor layer 40. First region A1 and second region A2 are adjacent to each other in the plan view of semiconductor layer 40, as illustrated in FIG. 2A.

Semiconductor layer 40 is formed by stacking semiconductor substrate 32 and low-concentration impurity layer 33.

Semiconductor substrate 32 is disposed on the bottom surface side of semiconductor layer 40 and comprises silicon containing impurity of a first conductivity type.

Low-concentration impurity layer 33 is disposed on the top surface side of semiconductor layer 40 in contact with semiconductor substrate 32, and includes impurity of the first conductivity type having concentration lower than that of the impurity of the first conductivity type in semiconductor substrate 32. Low-concentration impurity layer 33 may be formed on semiconductor substrate 32 by epitaxial growth, for example.

Metal layer 30 is formed in contact with the bottom surface of semiconductor layer 40 and comprises silver (Ag) or copper (Cu). Metal layer 30 may comprise a slight amount of element other than metals which gets mixed in as impurity in the process of manufacturing metal materials. Moreover, metal layer 30 may or may not be formed in contact with the entire bottom surface of semiconductor layer 40.

As illustrated in FIG. 1 and FIG. 2A, transistor 10 includes, on the surface of semiconductor layer 40 (i.e., the surface of low-concentration impurity layer 33), a plurality of (six here) first source pads 111 (first source pads 111a, 111b, 111c, 111d, 111e, and 111f) and first gate pad 119 which are joined to a mounting substrate via a bonding material during facedown mounting. Transistor 20 includes, on the surface of semiconductor layer 40 (i.e., the surface of low-concentration impurity layer 33), a plurality of (six here) second source pads 121 (second source pads 121a, 121b, 121c, 121d, 121e, and 121f) and second gate pad 129 which are joined to the mounting substrate via the bonding material during facedown mounting.

In a plan view, semiconductor layer 40 is rectangular in shape, transistor 10 and transistor 20 are aligned in a first direction in which the principal current flows, as shown in FIG. 1, FIG. 2A, and FIG. 2B. Semiconductor layer 40 has, in the plan view, one longer side 91 and other longer side 92 that are parallel to the first direction and one shorter side 93 and other shorter side 94 that are parallel to a direction orthogonal to the first direction. Namely, semiconductor layer 40 is a rectangle having longer sides extending in the first direction.

In FIG. 2A, central line 90 is a line that bisects rectangular semiconductor layer 40 in the first direction. Accordingly, central line 90 is a straight line extending in the direction orthogonal to the first direction in the plan view of semiconductor layer 40. As will be described later, when facedown mounting semiconductor device 1 on a printed wiring board, central line 90 approximately coincides with a portion (clearance) at which the wiring pattern stops and starts again on the printed wiring board in the plan view of semiconductor layer 40.

Boundary 90C is a boundary between first region A1 and second region A2. In the plan view of semiconductor layer 40, boundary 90C divides the area of semiconductor layer 40 in two, but does not always need to be a straight line. In the plan view of semiconductor layer 40, central line 90 and boundary 90C coincide with each other in some cases and do not coincide with each other in other cases.

As illustrated in FIG. 2A, in the plan view of semiconductor layer 40, first gate pad 119 is disposed such that none of first source pads 111 is disposed between first gate pad 119 and one longer side 91 and between first gate pad 119 and boundary 90C in the first direction.

In the plan view of semiconductor layer 40, first source pads 111 include a plurality of approximately rectangular first source pads (all of first source pads 111 are approximately rectangular here) that are disposed in a stripe pattern, with the lengthwise direction of each of first source pads 111 parallel to one longer side 91 and other longer side 92.

In the plan view of semiconductor layer 40, second gate pad 129 is disposed such that none of second source pads 121 is disposed between second gate pad 129 and other longer side 92 and between second gate pad 129 and boundary 90C in the first direction.

In the plan view of semiconductor layer 40, second source pads 121 include a plurality of approximately rectangular second source pads (all of second source pads 121 are approximately rectangular here) that are disposed in a stripe pattern, with the lengthwise direction of each of second source pads 121 parallel to one longer side 91 and other longer side 92.

Note that the number of first gate pads 119 and the number of second gate pads 129 are not limited to one as illustrated in FIG. 2A, and may be two or greater. Each of first gate pad 119 and second gate pad 129 may be approximately circular in shape, as illustrated in FIG. 2A, or may not have such a shape.

Note that the number of first source pads 111 and the number of second source pads 121 do not need to be limited to six as illustrated in FIG. 2A, and may be any plural number other than six. The arrangement of approximately rectangular first source pads 111 is not limited to the one illustrated in FIG. 2A. First source pads 111 may be disposed in a stripe pattern, with the lengthwise direction of each of first source pads 111 parallel to one shorter side 93 and other shorter side 94. Similarly, the arrangement of approximately rectangular second source pads 121 is not limited to the one illustrated in FIG. 2A. Second source pads 121 may be disposed in a stripe pattern, with the lengthwise direction of each of second source pads 121 parallel to one shorter side 93 and other shorter side 94.

As illustrated in FIG. 1 and FIG. 2A, first body region 18 containing impurity of a second conductivity type different from the first conductivity type is formed in first region A1 of low-concentration impurity layer 33. First source region 14 containing impurity of the first conductivity type, first gate conductor 15, and first gate insulating film 16 are formed in first body region 18. First source electrode 11 includes section 12 and section 13, and section 12 is connected to first source region 14 and first body region 18 via section 13. First gate conductor 15 is electrically connected to first gate pad 119.

Section 12 in first source electrode 11 is a layer to be bonded to solder in a reflow process during facedown mounting. In one non-limiting example, section 12 may be made of a metal material including one or more of nickel, titanium, tungsten, and palladium. The surface of section 12 may be plated with, for example, gold.

Section 13 in first source electrode 11 is a layer that connects section 12 and semiconductor layer 40. In one non-limiting example, section 13 may be made of a metal material including one or more of aluminum, copper, gold, and silver.

In second region A2 in low-concentration impurity layer 33, second body region 28 containing impurity of the second conductivity type is formed. Second source region 24 containing impurity of the first conductivity type, second gate conductor 25, and second gate insulating film 26 are formed in second body region 28. Second source electrode 21 includes section 22 and section 23, and section 22 is connected to second source region 24 and second body region 28 via section 23. Second gate conductor 25 is electrically connected to second gate pad 129.

Section 22 in second source electrode 21 is a layer to be bonded to solder in a reflow process during facedown mounting. In one non-limiting example, section 22 may be made of a metal material including one or more of nickel, titanium, tungsten, and palladium. The surface of section 22 may be plated with, for example, gold.

Section 23 in second source electrode 21 is a layer that connects section 22 and semiconductor layer 40. In one non-limiting example, section 23 may be made of a metal material including one or more of aluminum, copper, gold, and silver.

The above configurations of transistors 10 and 20 allow low-concentration impurity layer 33 and semiconductor substrate 32 to function as a common drain region serving as both the first drain region of transistor 10 and the second drain region of transistor 20.

Moreover, the principal current channel in semiconductor device 1 is the bidirectional channel from first source electrodes 11 to second source electrodes 21 via the first drain region, metal layer 30, and the second drain region.

As illustrated in FIG. 1, first body region 18 is covered with interlayer insulating layer 34 having an opening and is provided with section 13 of first source electrode 11 connected to first source region 14 via the opening of interlayer insulating layer 34. Interlayer insulating layer 34 and section 13 of first source electrode 11 are covered with passivation layer 35 having an opening and are provided with section 12 connected to section 13 of first source electrode 11 via the opening of passivation layer 35.

Second body region 28 is covered with interlayer insulating layer 34 having an opening and is provided with section 23 of second source electrode 21 connected to second source region 24 via the opening of interlayer insulating layer 34. Interlayer insulating layer 34 and section 23 of second source electrode 21 are covered with passivation layer 35 having an opening and are provided with section 22 connected to section 23 of second source electrode 21 via the opening of passivation layer 35.

Accordingly, first source pads 111 and second source pads 121 are regions at which first source electrodes 11 and second source electrodes 21 are partially exposed to the surface of semiconductor device 1, respectively, and are what is called terminal sections. Similarly, first gate pad 119 and second gate pad 129 are regions at which first gate electrode 19 (not shown in FIG. 1, FIG. 2A, and FIG. 2B) and second gate electrode 29 (not shown in FIG. 1, FIG. 2A, and FIG. 2B) are partially exposed to the surface of semiconductor device 1, respectively, and are what is called terminal sections. The source pads and the gate pads are hereinafter collectively defined as "electrode pads".

A standard design example of each structure in semiconductor device 1 is one in which the thickness of semiconductor layer 40 is from 10 μm to 90 μm, the thickness of metal layer 30 is from 10 μm to 90 μm, and the cumulative thickness of interlayer insulating layer 34 and passivation layer 35 is from 3 μm to 13 μm.

[2. Operations Performed by Semiconductor Device]

In semiconductor device 1, assuming, for example, that the first conductivity type is n type and the second conductivity type is p type, first source region 14, second source region 24, semiconductor substrate 32, and low-concentration impurity layer 33 may comprise an n-type semiconductor, and first body region 18 and second body region 28 may comprise a p-type semiconductor.

Moreover, assuming, for example, that the first conductivity type is p type and the second conductivity type is n type, first source region 14, second source region 24, semiconductor substrate 32, and low-concentration impurity layer 33 may comprise a p-type semiconductor, and first body region 18 and second body region 28 may comprise an n-type semiconductor.

The following description describes conductive operations performed by semiconductor device 1 in a case in which transistor 10 and transistor 20 are what is known as N-channel transistors where the first conductivity type is n type and the second conductivity type is p type.

In semiconductor device 1, when high voltage is applied to first source electrodes 11, low voltage is applied to second source electrodes 21, and voltage higher than or equal to a threshold is applied to second gate electrode 29 (second gate conductor 25) with respect to second source electrodes 21 as a reference, a conducting channel is formed in the vicinity of second gate insulating film 26 in second body region 28. As a result, a principal current flows along the channel from first source electrodes 11 to first body region 18 to low-concentration impurity layer 33 to semiconductor substrate 32 to metal layer 30 to semiconductor substrate 32 to low-concentration impurity layer 33 to the conducting channel formed in second body region 28 to second source region 24 and to second source electrodes 21, thereby placing semiconductor device 1 in a conductive state. Note that the interface between second body region 28 and low-concentration impurity layer 33 in this principal current channel includes a P-N junction and serves as a body diode. Since this principal current flows through metal layer 30, increasing the thickness of metal layer 30 increases the cross-sectional area of the principal current channel, which reduces the on-resistance of semiconductor device 1. This conductive state corresponds to the charge state illustrated in FIG. 3, which will be described later.

Similarly, in semiconductor device 1, when high voltage is applied to second source electrodes 21, low voltage is applied to first source electrodes 11, and voltage higher than or equal to a threshold is applied to first gate electrode 19 (first gate conductor 15) with respect to first source electrodes 11 as a reference, a conducting channel is formed in the vicinity of first gate insulating film 16 in first body region 18. As a result, a principal current flows along the channel from second source electrodes 21 to second body region 28 to low-concentration impurity layer 33 to semiconductor substrate 32 to metal layer 30 to semiconductor substrate 32 to low-concentration impurity layer 33 to the conducting channel formed in first body region 18 to first source region 14 and to first source electrodes 11, thereby placing semiconductor device 1 in a conductive state. Note that interface between first body region 18 and low-concentration impurity layer 33 in this principal current channel includes a P-N junction and serves as a body diode. This conductive state corresponds to the discharge state illustrated in FIG. 3, which will be described later.

[3. Configuration for Achieving Low On-Resistance of Semiconductor Device]

Figure 3:
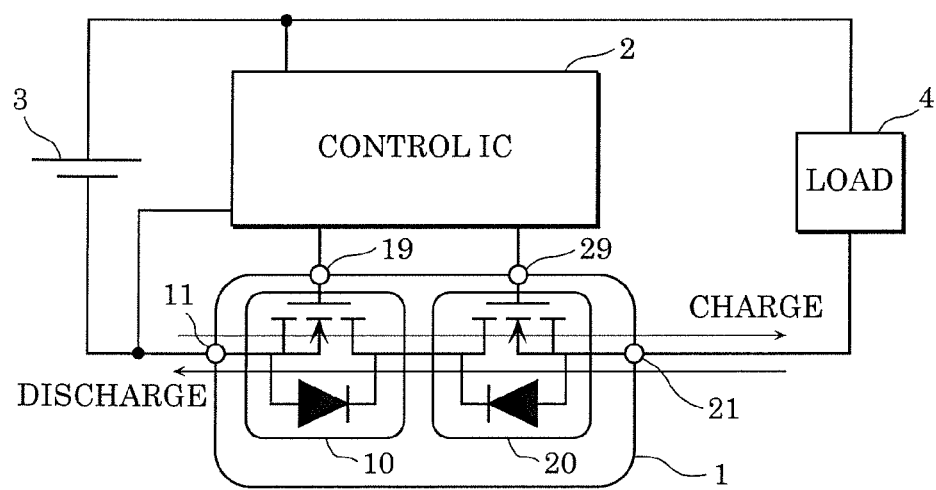
FIG. 3 is a circuit diagram illustrating an example of an application of a semiconductor device according to the embodiment in a charge/discharge circuit.

FIG. 3 is a circuit diagram illustrating an example of an application of semiconductor device 1 in a charge/discharge circuit, for which a lithium-ion battery pack is used, of a smartphone or tablet. In this application example, semiconductor device 1 controls discharging operations from battery 3 to load 4 and charging operations from load 4 to battery 3 depending on the control signal applied to first gate electrode 19 and second gate electrode 29 by control IC 2. When semiconductor device 1 is thus implemented as a charge/discharge circuit, for which a lithium-ion battery pack is used, in a smartphone or tablet, the on-resistance is required to be lower than or equal to a value in a range of from 2.2 mΩ to 2.4 mΩ as a 20 V withstand voltage specification, due to a short charge period, rapid charging, and other restrictions.

[4. Mounting, Circuit Design, and Conduction Resistance Reduction of Semiconductor Device]

Semiconductor device 1 is facedown mounted on a printed wiring board which is a mounting substrate, and is thus placed in a state ready for use.

Figure 4A:
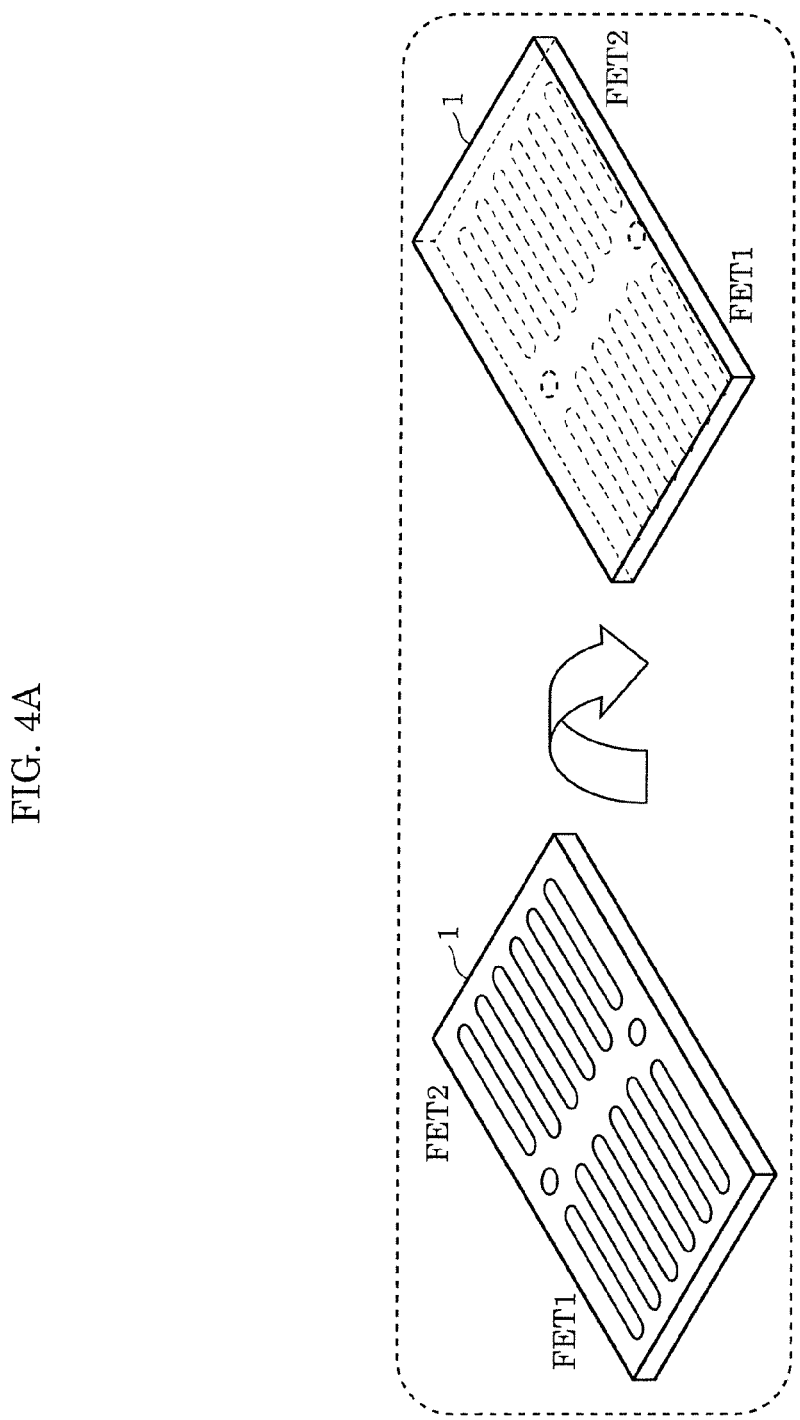
FIG. 4A is schematic illustration 1 of a relationship between a semiconductor device according to the embodiment, and a printed wiring board and a wiring pattern on the printed wiring board according to the embodiment.
Figure 4B:
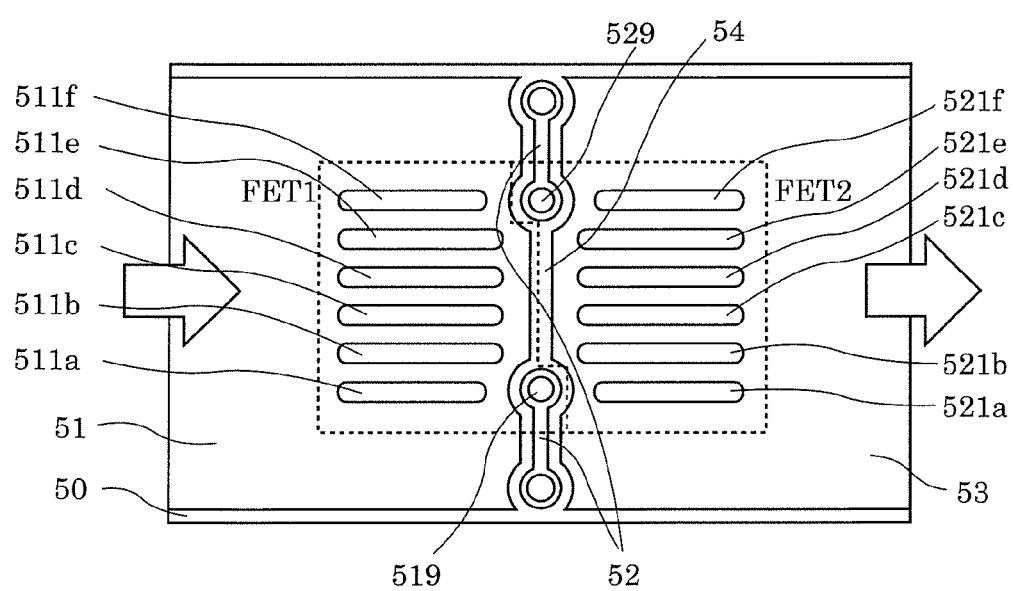
FIG. 4B is schematic illustration 2 of the relationship between the semiconductor device according to the embodiment, and the printed wiring board and the wiring pattern according to the embodiment.

FIG. 4A and FIG. 4B are each a schematic illustration of a relationship between semiconductor device 1, and printed wiring board 50 and wiring patterns 51 through 53 disposed on printed wiring board 50. In FIG. 4A and FIG. 4B as well as FIG. 5B, FIG. 6A, and FIG. 6B which are to be described later, the first transistor and the second transistor are referred to as FET1 and FET2, respectively.

Wiring patterns 51 through 53 are usually disposed on printed wiring board 50 based on any design. Since discharging operations from a battery and charging operations to the battery are controlled by switching on and off of current in the charge/discharge of a smartphone or tablet for which a lithium-ion battery pack is mainly used, wiring patterns 51 through 53 to be disposed on printed wiring board 50 include clearance (separation) 54 and semiconductor device 1 is mounted on clearance 54 to act as an intermediary between wiring patterns 51 through 53 separated by clearance 54. In FIG. 4B, clearance 54 is located between wiring patterns 51 and 53 in the center of the diagram.

For semiconductor device 1 that is facedown mounted, first source pads 111a through 111f are joined to the corresponding first mounting source pads 511a through 511f on wiring pattern 51, respectively, via a conductive bonding material such as solder. Hereinafter, first mounting source pads 511a through 511f are simply referred to as "first mounting source pads 511" in some cases. Similarly, second source pads 121a through 121f are joined to the corresponding second mounting source pads 521a through 521f on wiring pattern 53, respectively, via the conductive bonding material such as solder. Hereinafter, second mounting source pads 521a through 521f are simply referred to as "second mounting source pads 521" in some cases. Moreover, first gate pad 119 and second gate pad 129 are joined to the corresponding first mounting gate pad 519 and second mounting gate pad 529 on wiring pattern 52, respectively, via the conductive bonding material such as solder. Hereinafter, a case of using solder as a conductive bonding material is introduced as an example. In the case of using solder as a bonding material, reflow soldering is performed and heat treatment at the temperature of approximately 250 degrees Celsius is conducted.

Since it is assumed here, for convenience, that a principal current flowing through wiring patterns 51 and 53 on printed wiring board 50 flows from left to right in FIG. 4B (corresponds to the direction of current for charging in FIG. 3), the following describes how FIG. 4B relates to FIG. 3. In FIG. 4B as well as FIG. 5B, FIG. 6A, and FIG. 6B which are to be mentioned later, the principal current is schematically illustrated by outline arrows. In FIG. 3, wires that connect battery 3 and first source electrode 11 in semiconductor device 1 correspond to wiring pattern 51 in FIG. 4B. Wiring pattern 51 is connected to first source electrodes 11 via first mounting source pads 511, solders, and first source pads 111. In FIG. 3, wires which connect control IC2 to first gate electrode 19 (second gate electrode 29) in semiconductor device 1 correspond to wiring pattern 52 in FIG. 4B. Wiring pattern 52 is connected to first gate electrode 19 (second gate electrode 29) via first mounting gate pad 519 (second mounting gate pad 529), solders, and first gate pad 119 (second gate pad 129). In FIG. 3, wires that connect second source electrode 21 in semiconductor device 1 to load 4 correspond to wiring pattern 53 in FIG. 4B. Wiring pattern 53 is connected from second source electrodes 21 to loads 4 via second source pads 121, solders, and second mounting source pads 521.

Now, the description returns back to the description regarding semiconductor device 1, printed wiring board 50 on which semiconductor device 1 is to be mounted, and wiring patterns 51 through 53. Semiconductor device 1 is mounted to act as an intermediary between wiring patterns 51 and 53 sandwiching clearance 54. As long as voltage that is greater than or equal to a threshold voltage is not applied to second gate electrode 29 (second gate pad 129), current does not flow through semiconductor device 1.

With the application of the voltage that is greater than or equal to the threshold voltage to second gate electrode 29, the principal current channel of semiconductor device 1 opens and current flows through wiring patterns 51 and 53 on printed wiring board 50. Once the principal current channel opens, semiconductor device 1 is functionally identical to a resistive element or a heating element. Accordingly, in the application of semiconductor device 1 to a circuit expected to continue on-state for a long time, as in the case of a smartphone or a tablet for which a lithium-ion battery pack is used, reduction in conduction resistance of a principal current channel in the circuit is important in terms of low consumption power and dissipation enhancement of the circuit. It is therefore desirable not to allow, to the extent possible, any resistive element that constitutes an obstacle in the principal current channel of the circuit.

Resistance at the time of conduction of current in the entire circuit including semiconductor device 1 is referred to as conduction resistance whereas resistance limited to that in semiconductor device 1 in on-state is referred to as on-resistance. A region through which current flows on printed wiring board 50 in the plan view of printed wiring board 50 is referred to as a power line. Referring to FIG. 4B, a power line is linear and has a width approximately identical to that of wiring pattern 51 when the current flows through wiring pattern 51 or to that of wiring pattern 53 when the current flows through wiring pattern 53. When the current flows over clearance 54 (a principal current flows through semiconductor device 1), the power line becomes linear with the approximately same width as the shorter side length of semiconductor device 1 (a side length parallel to the direction orthogonal to the direction in which the principal current flows). In order to reduce conduction resistance, it is required to design a semiconductor device so that the width of a power line is as wide as possible and no obstacle such as a resistive element is placed in the power line to the extent possible.

It is desirable to design semiconductor device 1 having a function to act as an intermediary for clearance 54 such that transistor 10 (or first region A1) and transistor 20 (or second region A2) are adjacent to each other, in the plan view of semiconductor device 1, in the direction in which the principal current flows in the power line. Accordingly, boundary 90C lies in the direction approximately orthogonal to the direction in which the principal current flows and thus overlaps central line 90, in many cases, although not thoroughly coinciding with central line 90.

Figure 5A:
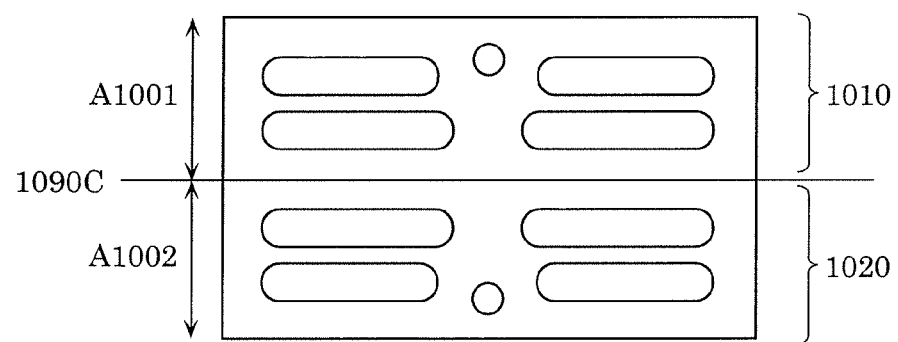
FIG. 5A is schematic illustration 1 of a relationship between a semiconductor device according to a first comparative example, and a printed wiring board and a wiring pattern on the printed wiring board according to the first comparative example.
Figure 5B:
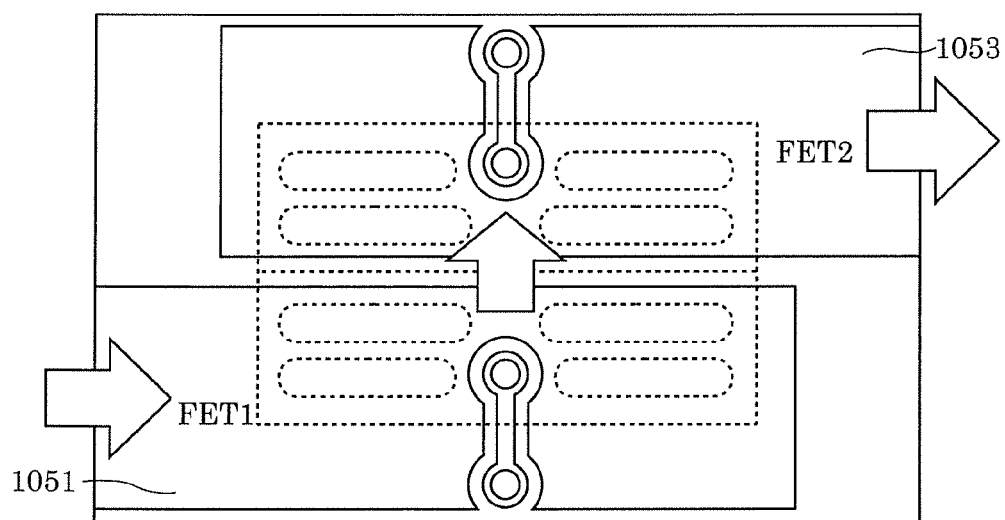
FIG. 5B is schematic illustration 2 of the relationship between the semiconductor device according to the first comparative example, and the printed wiring board and the wiring pattern according to the first comparative example.

What has been discussed above will be described with reference to FIG. 5A and FIG. 5B. FIG. 5A and FIG. 5B are each a schematic illustration of a relationship between a semiconductor device according to a first comparative example, and a printed wiring board and wiring patterns 1051 and 1053 according to the first comparative example which are disposed on the printed wiring board when mounting the semiconductor device on the printed wiring board.

When transistor 1010 (or first region A1001) and transistor 1020 (or second region A1002) are disposed adjacent to each other in a direction orthogonal to a direction in which a principal current flows from left to right in the semiconductor device according to the first comparative example, as illustrated in FIG. 5A, the current flowing from left through wiring pattern 1051 has no choice but to form a channel along which the current firstly turns to the orthogonal direction and again changes the direction by 90 degrees to flow rightward through wiring pattern 1053, as illustrated in FIG. 5B. As is obvious when compared with the case illustrated in FIG. 4B, wiring patterns 1051 and 1053 have to be formed by dividing into two the limited width of the printed wiring board according to the first comparative example, as in the case like FIG. 5B, and it is thus impossible to sufficiently increase the width of the wiring pattern, that is, the width of a power line. It is therefore desirable that transistor 10 (or first region A1) and transistor 20 (or second region A2) are adjacent to each other in the plan view of semiconductor layer 40 in the direction in which the principal current flows.

Not placing any resistive element in a power line to the extent possible is a primary intention of the present disclosure. Semiconductor device 1 is compared with a semiconductor device according to a second comparative example, and advantageous effects attained by semiconductor device 1 will be described with reference to FIG. 6A and FIG. 6B. The second comparative example is one of typical conventional examples.

Figure 6A:
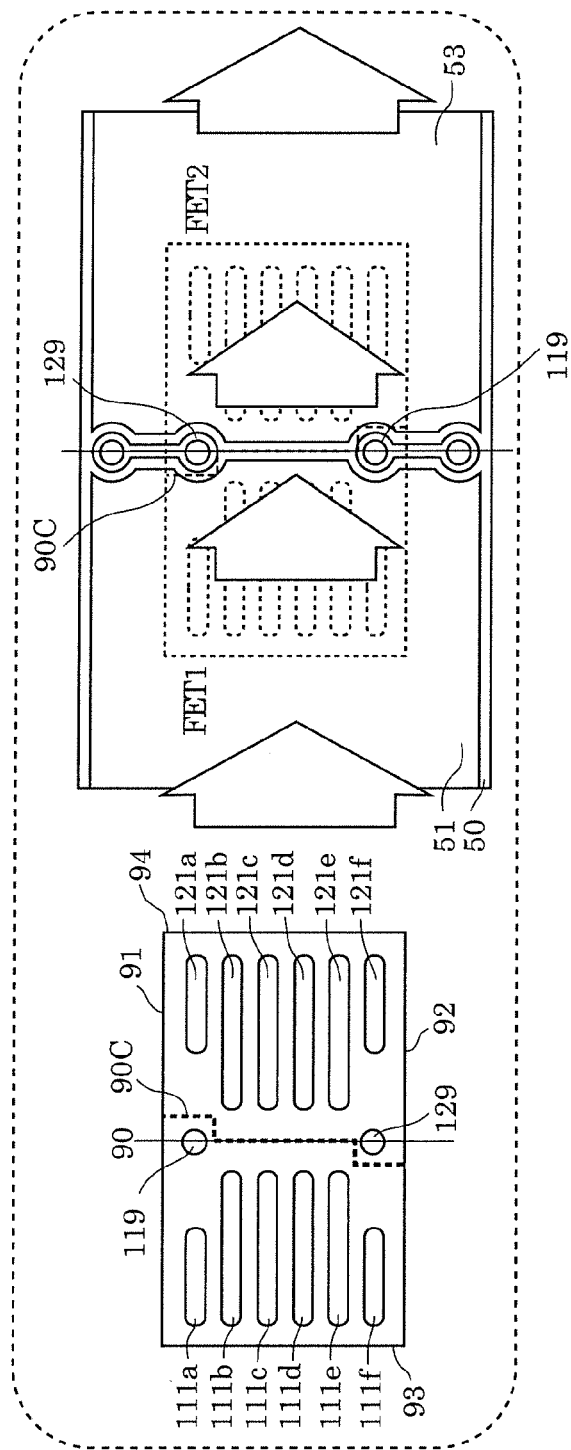
FIG. 6A schematically illustrates how current flows on a printed wiring board according to the embodiment.

FIG. 6A schematically illustrates how a principal current flows through printed wiring board 50 on which semiconductor device 1 is mounted. It is assumed here, for convenience, that the principal current flowing through wiring patterns 51 and 53 on printed wiring board 50 flows from left to right, as illustrated in FIG. 6A.

Figure 6B:
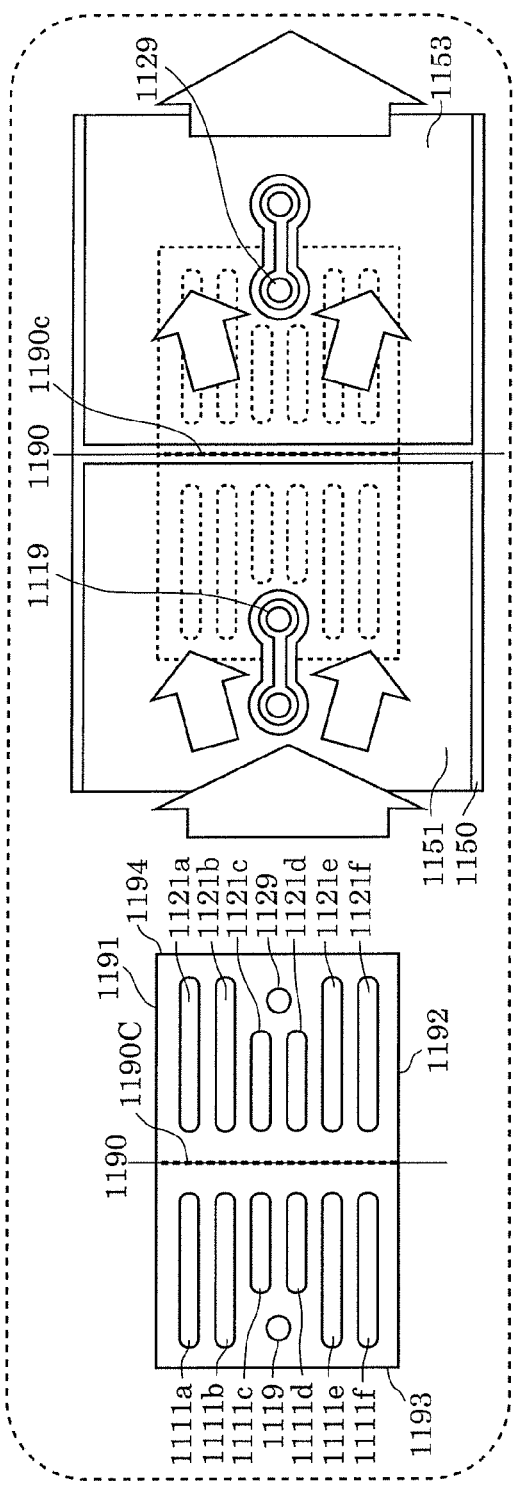
FIG. 6B schematically illustrates how current flows on a printed wiring board according to a second comparative example.

FIG. 6B schematically illustrates how a principal current flows through the printed wiring board according to the second comparative example on which the semiconductor device according to the second comparative example is mounted. It is assumed here, for convenience, that the principal current flowing through wiring patterns 1151 and 1153 on the printed wiring board flows from left to right, as illustrated in FIG. 6B.

Semiconductor device 1 and the semiconductor device according to the second comparative example have identical chip sizes.

In semiconductor device 1, first gate pad 119 and second gate pad 129 are disposed in the vicinity of one longer side 91 and other longer side 92, respectively, in the plan view of semiconductor layer 40. On the other hand, in the semiconductor device according to the second comparative example, first gate pad 1119 and second gate pad 1129 are disposed near the central region of one shorter side 1193 and other shorter side 1194, respectively, in the plan view of the semiconductor layer.

In the comparison between semiconductor device 1 and the semiconductor device according to the second comparative example, a total area of first source pads 111 equals to a total area of first source pads 1111 and a total area of second source pads 121 equals to a total area of second source pads 1121. Therefore, a difference in the total area of the source pads between semiconductor device 1 and the semiconductor device according to the second comparative example has no influence on on-resistance. There is no other difference between the two semiconductor devices in terms of structure such that affects device functions and properties.

The gate electrodes (or gate pads) and the vicinity regions in semiconductor device 1 or the semiconductor device according to the second comparative example (hereinafter, simply referred to as "semiconductor device" when there is no need to differentiate between the two semiconductor devices) are originally provided with control functions of allowing current to flow along a principal current channel in the semiconductor device. In order to reduce on-resistance of the semiconductor device, ensuring, to the extent possible, a wide area for a principal current channel (active regions (regions each enclosed by a dotted line in FIG. 1 in semiconductor device 1)) is required on one hand. On the other hand, however, the gate electrodes and the vicinity regions should be regarded as obstacle regions impeding the conduction of current and invading, as the portions of the control functions, the principal current channel (active regions (regions each enclosed by a dotted line in FIG. 1 in semiconductor device 1)). In short, the gate electrodes and the vicinity regions are indispensable for the functions of the semiconductor device, but at the same time, these regions are to be reduced as much as possible for the reduction of on-resistance.

When semiconductor device 1 is compared with the semiconductor device according to the second comparative example based on the above observations, first gate pad 1119 and second gate pad 1129 are disposed at the center of a power line in the semiconductor device according to the second comparative example, constituting obstacles to the conduction of current.

In the observation of the flow of a principal current in an entire circuit in the semiconductor device according to the second comparative example, since first gate pad 1119 is disposed at the center of the width of the power line, the principal current flowing with a full width of wiring pattern 1151 from left in the diagram is split to avoid first gate pad 1119 (see FIG. 6B). The split principal currents join near the center of the semiconductor device according to the second comparative example. However, since second gate pad 1129 is disposed at the center of the width of the power line, the current splits again and flows rightward in the diagram.

In contrast, semiconductor device 1, first gate pad 119 and second gate pad 129 are disposed at the side edge of the power line and thus hardly constitute any obstacle to the conduction of current.

In the observation of the flow of a principal current in an entire circuit in semiconductor device 1, since first gate pad 119 and second gate pad 129 are disposed at the side edge of the power line, the principal current flowing with a full width of wiring pattern 51 from left in the diagram does not split because of the disposition of first gate pad 119 and second gate pad 129 (see FIG. 6A). The principal current thus flows from left to right in the diagram while roughly maintaining the flow without any obstacles except a limitation imposed on the widths of the shorter sides of semiconductor device 1.

Based on the above discussion, semiconductor device 1, as compared with the semiconductor device according to the second comparative example, has less influence on the flow of the principal current and is more effective in reducing an increase in conduction resistance.

Note that the expression "first gate pad 119 and second gate pad 129 are disposed at the side edge of the power line" means that first gate pad 119 is disposed such that none of first source pads 111 is disposed between first gate pad 119 and one longer side 91 of semiconductor device 1, which is parallel to the first direction of semiconductor device 1, and second gate pad 129 is disposed such that none of second source pads 121 is disposed between second gate pad 129 and other longer side 92 of semiconductor device 1, which is parallel to the first direction.

Moreover, in semiconductor device 1, first gate pad 119 is disposed in a location that is not only at the side edge of the power line, but is also where no other first source pad 111 is disposed between first gate pad 119 and boundary 90C in the first direction. Similarly, second gate pad 129 is disposed in a location that is not only at the side edge of the power line, but is also where no other second source pad 121 is disposed between second gate pad 129 and boundary 90C in the first direction. Namely, first gate pad 119 and second gate pad 129 are disposed in the vicinity of boundary 90C in the plan view of semiconductor device 1. Such a disposition further reduces influence on the linear flow of a principal current in terms of geometry, compared to a case where the gate pads are disposed in different locations. Accordingly, the effect of reducing an increase in conduction resistance can be attained.

With a single-minded dedication to experiments, the inventors have obtained the above knowledge and arrived, based on the knowledge, at semiconductor device 1 producing an advantageous effect of reducing conduction resistance in an entire circuit.

Semiconductor device 1 is a chip-size-package-type semiconductor device that is facedown mountable and includes: a semiconductor layer; a metal layer disposed in contact with the bottom surface of the semiconductor layer; a first vertical metal oxide semiconductor (MOS) transistor disposed in a first region of the semiconductor layer; and a second vertical MOS transistor disposed in a second region of the semiconductor layer. The second region is adjacent to the first region in a plan view of the semiconductor layer. The semiconductor layer includes a semiconductor substrate. On the surface of the semiconductor layer, the first vertical MOS transistor includes first source pads and a first gate pad, and the second vertical MOS transistor includes second source pads and a second gate pad. The first source pads, the first gate pad, the second source pads, and the second gate pad are joined to a mounting substrate during facedown mounting. The semiconductor substrate functions as a common drain region shared between the first vertical MOS transistor and the second vertical MOS transistor. In the plan view: the semiconductor layer is rectangular in shape; the first vertical MOS transistor and the second vertical MOS transistor are aligned in a first direction in which a principal current flows; the first gate pad is disposed such that none of the first source pads is disposed (i) between the first gate pad and a first side that is parallel to the first direction and located closest to the first gate pad among four sides of the semiconductor layer and (ii) between the first gate pad and a boundary in the first direction between the first region and the second region; and the second gate pad is disposed such that none of the second source pads is disposed (i) between the second gate pad and a second side that is parallel to the first direction and located closest to the second gate pad among the four sides of the semiconductor layer and (ii) between the second gate pad and the boundary in the first direction.

According to semiconductor device 1 having the aforementioned configuration, first gate pad 119 and second gate pad 129, which are the control function portions that control a principal current and could constitute obstacles in a power line, are disposed at the side edge of the power line. Thus, the principal current is not split and it is effective to reduce an increase in conduction resistance.

Moreover, since first gate pad 119 and second gate pad 129 are disposed in the vicinity of boundary 90C, influence on the linear flow of the principal current is much less in terms of geometry, compared to a case where the gate pads are disposed in different locations.

FIG. 7A through FIG. 7G, FIG. 8A through FIG. 8D, FIG. 9A, and FIG. 9B are each a schematic illustration of an example of the arrangement of electrode pads which satisfies the conditions for realizing semiconductor device 1 having the aforementioned configuration.

Figure 9A:
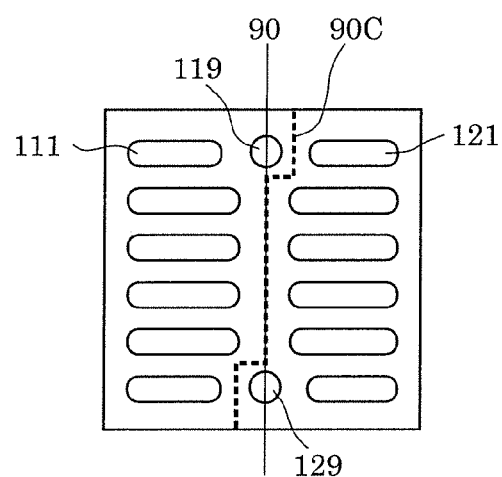
FIG. 9A is a schematic illustration of an example of an arrangement of electrode pads of a semiconductor device according to the embodiment.
Figure 9B:
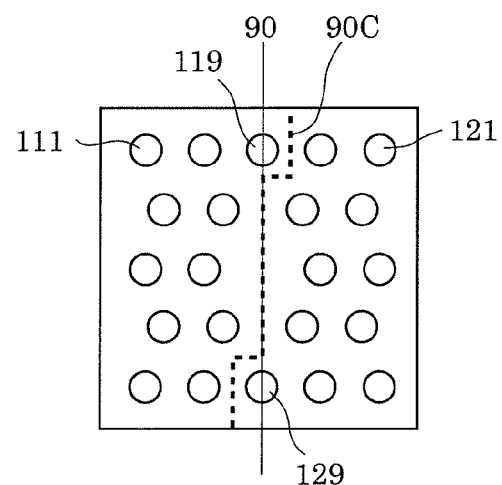
FIG. 9B is a schematic illustration of an example of the arrangement of electrode pads of the semiconductor device according to the embodiment.

The shape of semiconductor device 1 may be such that semiconductor layer 40 is approximately square in shape, as illustrated in FIG. 9A and FIG. 9B, for example. Since it is not appropriate to use the terms "longer side" and "shorter side" for semiconductor layer 40 in this case, a relationship between semiconductor device 1 and the arrangement of electrode pads will be described using the expression "first direction" which is a direction in which transistor 10 (or first region A1) and transistor 20 (or second region A2) are aligned and the expression "direction orthogonal to the first direction".

To achieve a configuration in which neither first gate pad 119 nor second gate pad 129 constitutes any obstacle in a power line, the second side of semiconductor device 1 may be a side opposite the first side.

With such a configuration, it is possible to enhance symmetry in the influence by which the flow of the principal current in semiconductor device 1 is impeded by first gate pad 119 and second gate pad 129. Considering that the principal current flowing through semiconductor device 1 has a bidirectional channel, with the arrangement of electrode pads such that transistor 10 and transistor 20 are line-symmetric or point-symmetric, it is possible to obtain an effect of inhibiting unbalanced conduction properties and calorific properties in semiconductor device 1 due to a difference between forward and backward directions in which the principal current flows. For this reason, the aforementioned configuration is desirable. When a circuit utilizing semiconductor device 1 is mounted to a lithium-ion battery pack of, for instance, a smartphone or a tablet, there is no need to handle the battery particularly differently between charging and discharging.

According to semiconductor device 1 having the aforementioned configuration, it is possible to dispose first gate pad 119 and second gate pad 129, which are the control function portions that control a principal current, in the vicinity of central line 90 (directly on the central line, to be specific). By utilizing locations near central line 90 of semiconductor device 1 for disposing first gate pad 119 and second gate pad 129, it is possible to make use, more or less for a region to dispose the gate pads, of a region in which a principal current channel (active regions, regions each enclosed by a dotted line in FIG. 1) is not originally formed. Thus, it is possible to inhibit the ratio at which the active regions are invaded, compared to a case where the gate pads are disposed in different locations. The resulting effect enables reduction of on-resistance. Moreover, with the reduction of on-resistance, an effect of inhibiting heat generation can be also expected.

Furthermore, semiconductor device 1 having the aforementioned configuration produces an effect of further reducing on-resistance of semiconductor device 1. Originally, it is natural to design semiconductor device 1 by disposing source pads with a slightly wider space between first source pads 111 and second source pads 121 at boundary 90C between first region A1 and second region A2 in order to avoid the short circuits between first source pads 111 and second source pads 121. With semiconductor device 1 having the aforementioned configuration, as is obvious from the comparison between FIG. 6A and FIG. 6B, since this space, in which nothing is originally provided, is effectively used for providing gate pads, the area that the source pads can occupy increases in other areas. Accordingly, it is possible to increase the total areas of first source pads 111 and second source pads 121 all the more. Namely, the effect of reducing on-resistance can be appreciated.

Figure 7A:
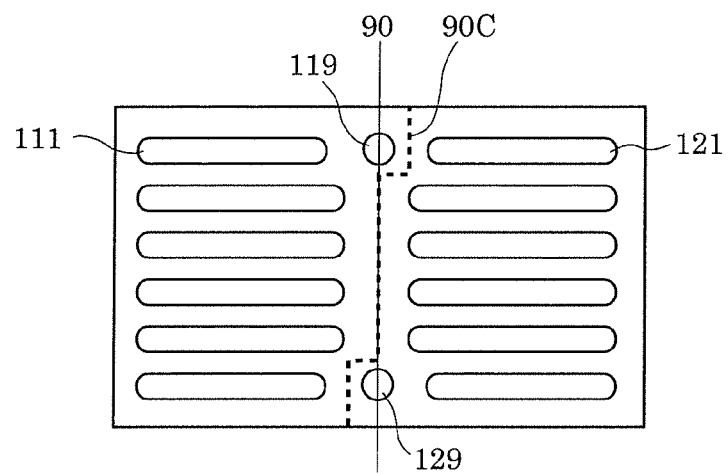
FIG. 7A is a schematic illustration of an example of an arrangement of electrode pads of a semiconductor device according to the embodiment.
Figure 7B:
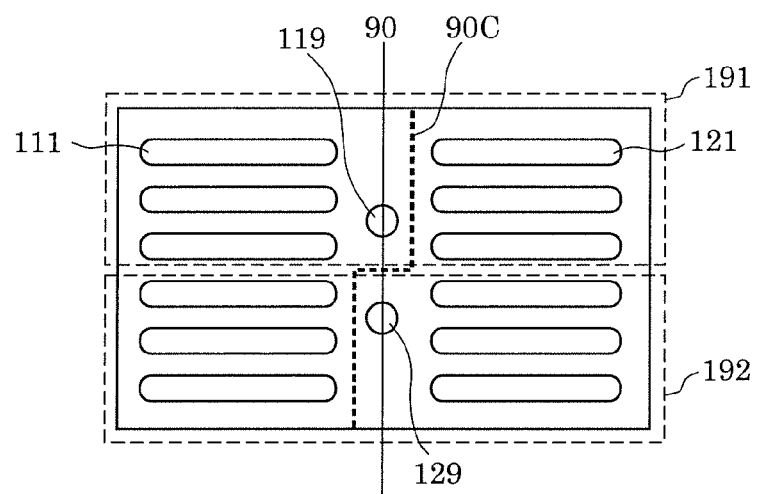
FIG. 7B is a schematic illustration of an example of the arrangement of electrode pads of the semiconductor device according to the embodiment.
Figure 7C:
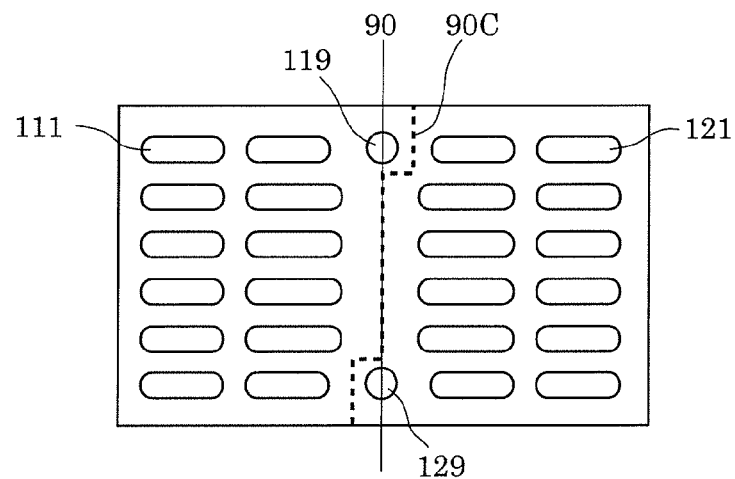
FIG. 7C is a schematic illustration of an example of the arrangement of electrode pads of the semiconductor device according to the embodiment.

First source pads 111 and second source pads 121 may be divided in two in the lengthwise direction of semiconductor device 1, as illustrated in FIG. 7C. In this case, the division is effective to reduce mounting defects, such as solder protrusion when semiconductor device 1 is mounted. In addition, another effect of promoting the permeation of an under-filling material can be obtained. However, when the total areas of first source pads 111 and second source pads 121 are excessively reduced, on-resistance increases as its side effect. Therefore, whether to further divide first source pads 111 and second source pads 121 in two in the lengthwise direction of semiconductor device 1 is determined as a trade-off between the reduction of on-resistance and the reduction of mounting defects.

Although FIG. 7A through FIG. 7D each describe an example of a configuration in which boundary 90C does not coincide with central line 90, the location of boundary 90C should not be limited to those illustrated in FIG. 7A through FIG. 7D.

Figure 7D:
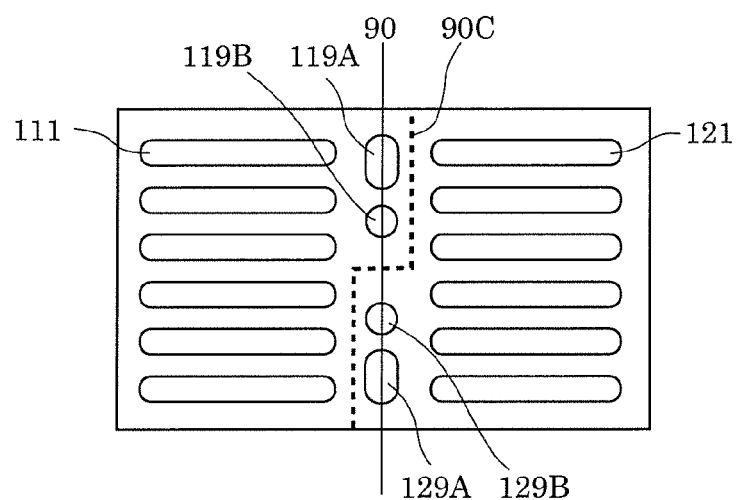
FIG. 7D is a schematic illustration of an example of the arrangement of electrode pads of the semiconductor device according to the embodiment.

The numbers of first gate pads 119 and second gate pads 129 may be plural, as illustrated in FIG. 7D. The shapes of one or more first gate pads 119 (two first gate pads of 119A and 119B in FIG. 7D) and one or more second gate pads 129 (two second gate pads of 129A and 129B in FIG. 7D) are not limited to approximately circular shapes, and what is more, the shapes need not be identical among the gate pads.

In the case where the number of first gate pads 119 is plural, it is important to dispose first gate pads 119 such that none of first source pads 111 is disposed at a location between first gate pad 119 and a side of semiconductor layer 40, which is parallel to the first direction of semiconductor device 1, or a location between first gate pad 119 and boundary 90C in the first direction. Nevertheless, another first gate pad 119 may be disposed at either of the aforementioned locations. Similarly, in the case where the number of second gate pads 129 is plural, it is important to dispose second gate pads 129 such that none of second source pads 121 is disposed at a location between second gate pad 129 and a side of semiconductor layer 40, which is parallel to the first direction of semiconductor device 1, or a location between second gate pad 129 and boundary 90C in the first direction. Nevertheless, another second gate pad 129 may be disposed at either of the aforementioned locations.

Figure 7E:
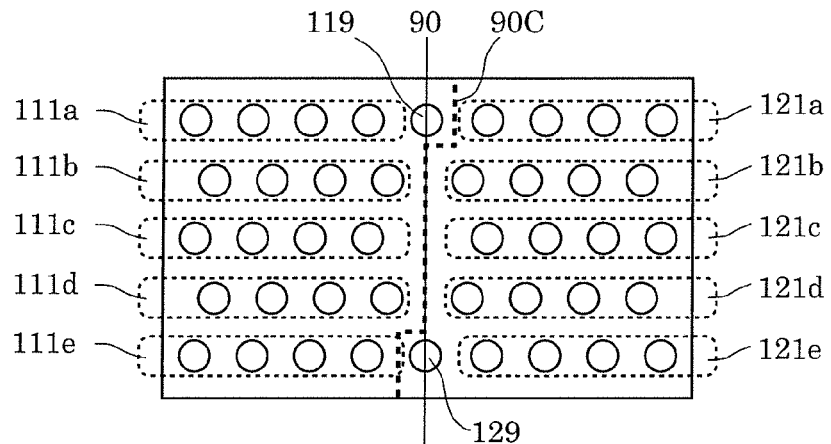
FIG. 7E is a schematic illustration of an example of the arrangement of electrode pads of the semiconductor device according to the embodiment.
Figure 7F:
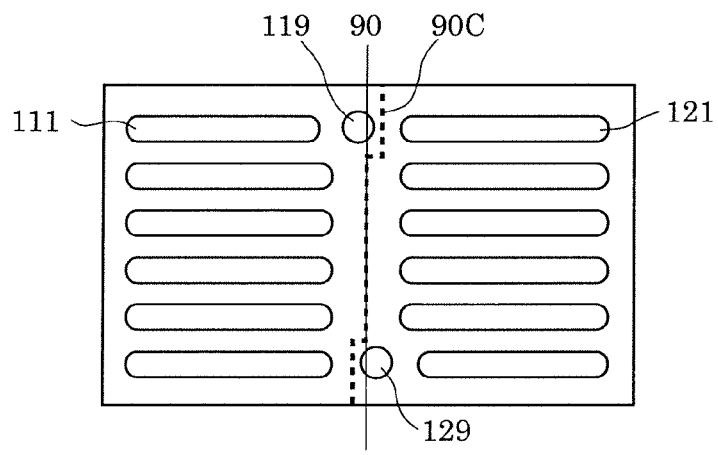
FIG. 7F is a schematic illustration of an example of the arrangement of electrode pads of the semiconductor device according to the embodiment.
Figure 7G:
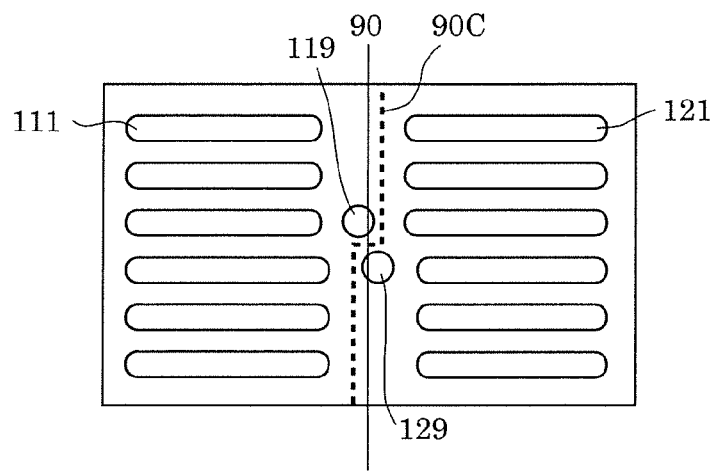
FIG. 7G is a schematic illustration of an example of the arrangement of electrode pads of the semiconductor device according to the embodiment.

Moreover, the shape of each of first source pads 111 and second source pads 121 is not limited to an approximately rectangular shape, and may be an approximately circular shape and two or more approximately circular first or second source pads may constitute a group, as illustrated in FIG. 7E. It is, however, desirable that each group be disposed within a stripe-shaped region extending in the first direction. The terminology "disposed within a stripe-shaped region" means that objects to be disposed are disposed within a certain width in a certain direction. When the source pads are approximately circular in shape and constitute a group, as illustrated in FIG. 7E, each group is referred to as first source pad 111a, for instance.

The shapes of the source pads may be approximately circular and two or more approximately circular source pads may constitute a group also in the case where semiconductor layer 40 is approximately square in shape, as illustrated in FIG. 9B.

Furthermore, it is desirable that the first gate pad and the second gate pad are each disposed on a central line that bisects the semiconductor layer in the first direction.

With such a configuration, it is possible to enhance symmetry in the influence by which the flow of the principal current in semiconductor device 1 is impeded by first gate pad 119 and second gate pad 129.

Semiconductor device 1 having the aforementioned configuration is illustrated, for example, in FIG. 7B. Focusing on the local regions of semiconductor device 1 illustrated in FIG. 7B, first local region 191, as compared with first local region 291 of semiconductor device 1 illustrated in FIG. 8D, has higher symmetry between a case where a principal current flows from transistor 10 to transistor 20 and a case where a principal current flows from transistor 20 to transistor 10. Similarly, in semiconductor device 1 illustrated in FIG. 7B, second local region 192, as compared with second local region 292 of semiconductor device 1 illustrated in FIG. 8D, has higher symmetry between the case where a principal current flows from transistor 10 to transistor 20 and the case where a principal current flows from transistor 20 to transistor 10.

Thus, with semiconductor device 1 having the aforementioned configuration, it is possible to enhance symmetry in the influence by which the flow of a principal current in semiconductor device 1, when locally observed, is impeded by first gate pad 119 and second gate pad 129.

Since it is possible to reduce even more the ratio at which the gate electrodes invade the active regions, effects of further reducing conduction resistance and inhibiting heat generation, which are brought by the reduction of the ratio, can be expected. Since spaces, in which nothing is originally provided, in the vicinity of boundary 90C between first region A1 and second region A2 are effectively used for providing gate pads, it is possible to further increase the total areas of first source pads 111 and second source pads 121. Namely, the effect of reducing on-resistance can be appreciated even more.

Figure 8A:
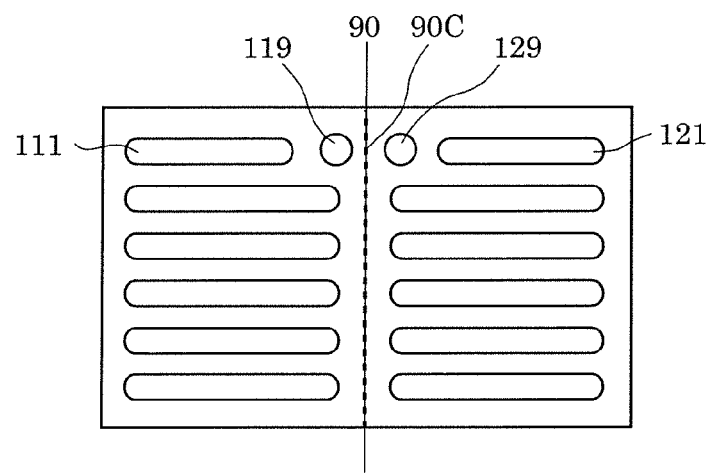
FIG. 8A is a schematic illustration of an example of the arrangement of electrode pads of the semiconductor device according to the embodiment.
Figure 8B:
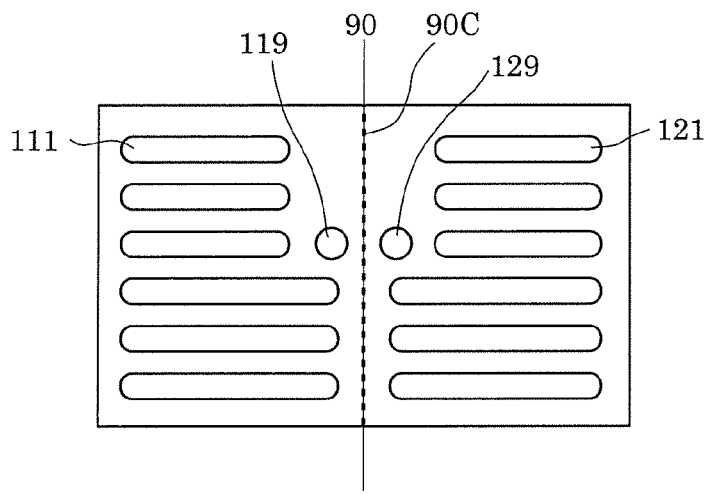
FIG. 8B is a schematic illustration of an example of the arrangement of electrode pads of the semiconductor device according to the embodiment.
Figure 8C:
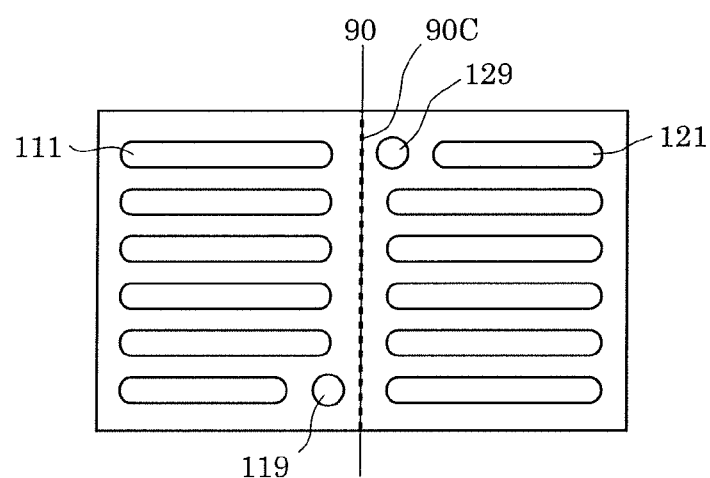
FIG. 8C is a schematic illustration of an example of the arrangement of electrode pads of the semiconductor device according to the embodiment.

The second side of semiconductor device 1 may be a side identical to the first side, as illustrated in FIG. 8A and FIG. 8B.

With such a configuration, it is possible to collect, in one place in semiconductor device 1, first gate pad 119 which is a control function portion of transistor 10 and second gate pad 129 which is a control function portion of transistor 20. Since it is possible to collectively dispose a control system on one side also in wiring patterns on a printed wiring board, semiconductor device 1 having the aforementioned configuration contributes to the enhancement of flexibility in terms of circuit design.

As has been described so far, the inventors believe that it is important to satisfy the following two conditions for the disposition of first gate pad 119 and second gate pad 129 in order to enhance the effect of reducing on-resistance of semiconductor device 1. Namely, (1) dispose gate pads in the vicinity of a side parallel to the first direction and (2) dispose the gate pads in the vicinity of central line 90. The underlying concepts of the two conditions are: (1) dispose control function portions, which could constitute obstacles in a principal current channel, at the side edge of a power line; and (2) dispose the control function portions in an area in which no effective region is originally provided.

In the pursuant of (2) out of the two conditions, it can be said that the most desirable is that the boundary extends in a crank shape in the plan view.

For, according to semiconductor device 1 having the aforementioned configuration, it is possible to dispose first gate pad 119 and second gate pad 129, which are the control function portions to control a principal current, in the vicinity of central line 90 (directly on the central line, to be specific). As described above, by utilizing locations near central line 90 of semiconductor device 1 for disposing first gate pad 119 and second gate pad 129, it is possible to make use, more or less for a region to dispose the gate pads, of a region in which a principal current channel (active regions, regions each enclosed by a dotted line in FIG. 1) is not originally formed. Thus, it is possible to inhibit the ratio at which the active regions are invaded, compared to a case where the gate pads are disposed in different locations. The resulting effect enables reduction of on-resistance. Moreover, with the reduction of on-resistance, the effect of inhibiting heat generation can be also expected.

Figure 8D:
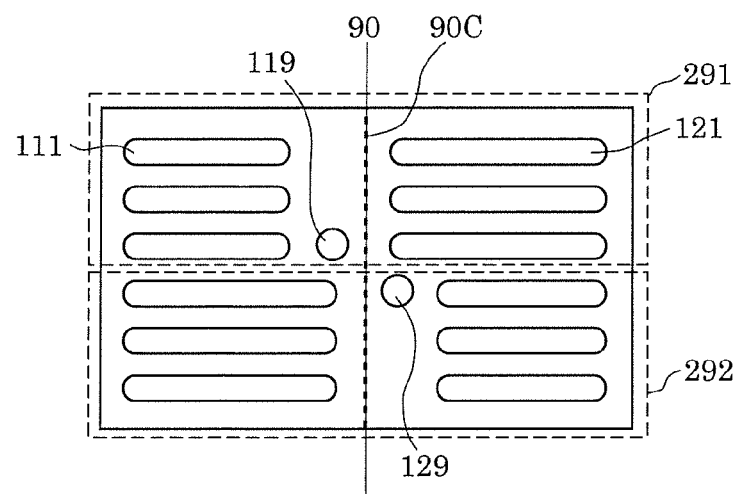
FIG. 8D is a schematic illustration of an example of the arrangement of electrode pads of the semiconductor device according to the embodiment.

It is desirable to place the center of first gate pad 119 and the center of second gate pad 129 both on central line 90, as illustrated, for example, in FIG. 7A, rather than to dispose first gate pad 119 and second gate pad 129 at the locations illustrated in FIG. 8D, that is, at the locations where first gate pad 119 and second gate pad 129 are not on central line 90.

Figure 10:
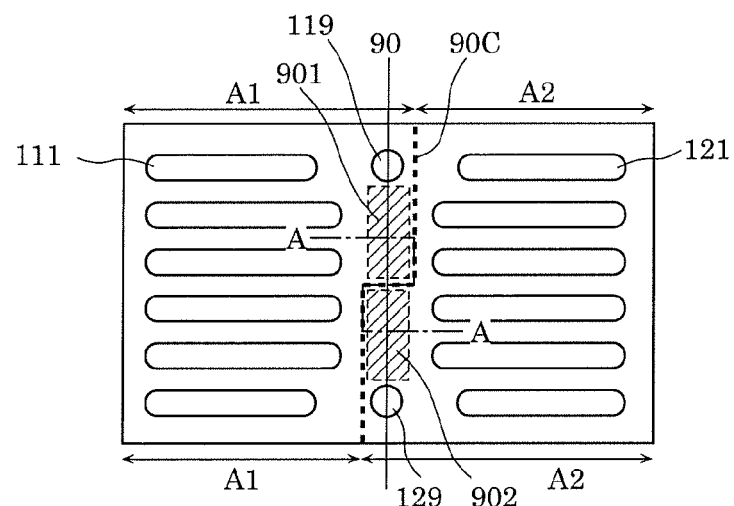
FIG. 10 is a schematic illustration of an example of an arrangement of electrode pads of a semiconductor device according to the embodiment.

When first gate pad 119, second gate pad 129, and boundary 90C are disposed at the locations as illustrated in FIG. 10, it is desirable to dispose, in region 901 that belongs to first region A1, a third vertical MOS transistor (hereinafter also referred to as "transistor 60") for surge current diversion for transistor 10 and to dispose, in region 902 that belongs to second region A2, a fourth vertical MOS transistor (hereinafter also referred to as "transistor 70") for surge current diversion for transistor 20.

Namely, semiconductor device 1 further includes the third vertical MOS transistor disposed in the first region, for surge current diversion for the first vertical MOS transistor, and the fourth vertical MOS transistor disposed in the second region, for surge current diversion for the second vertical MOS transistor. It is desirable to dispose the third vertical MOS transistor and the fourth vertical MOS transistor between the first gate pad and the second gate pad in the plan view of the semiconductor layer.

Figure 11:
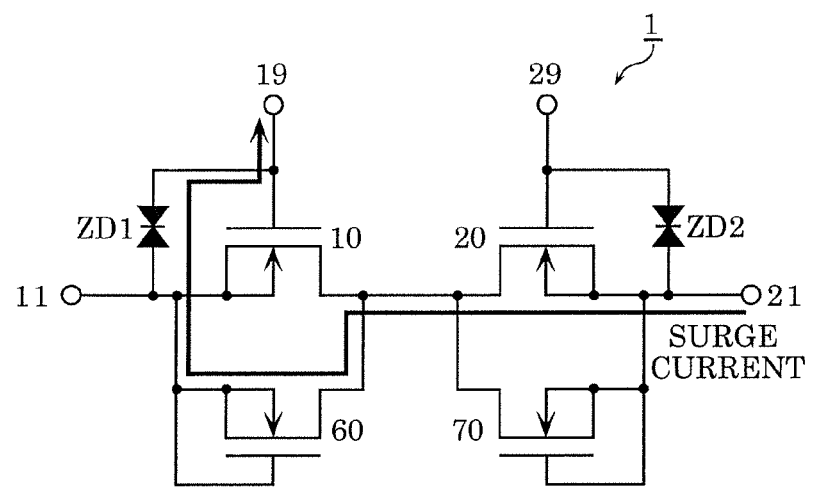
FIG. 11 is a circuit diagram illustrating one example of a semiconductor device according to the embodiment.

FIG. 11 is a circuit diagram illustrating one example of semiconductor device 1 having the aforementioned configuration.

As illustrated in FIG. 11, semiconductor device 1 having the aforementioned configuration further includes transistor 60 and transistor 70 in addition to the configuration of semiconductor device 1 illustrated in FIG. 3. FIG. 11 also illustrates first bidirectional Zener diode ZD1 and second bidirectional Zener diode ZD2 which are not shown in FIG. 3.

Figure 12:
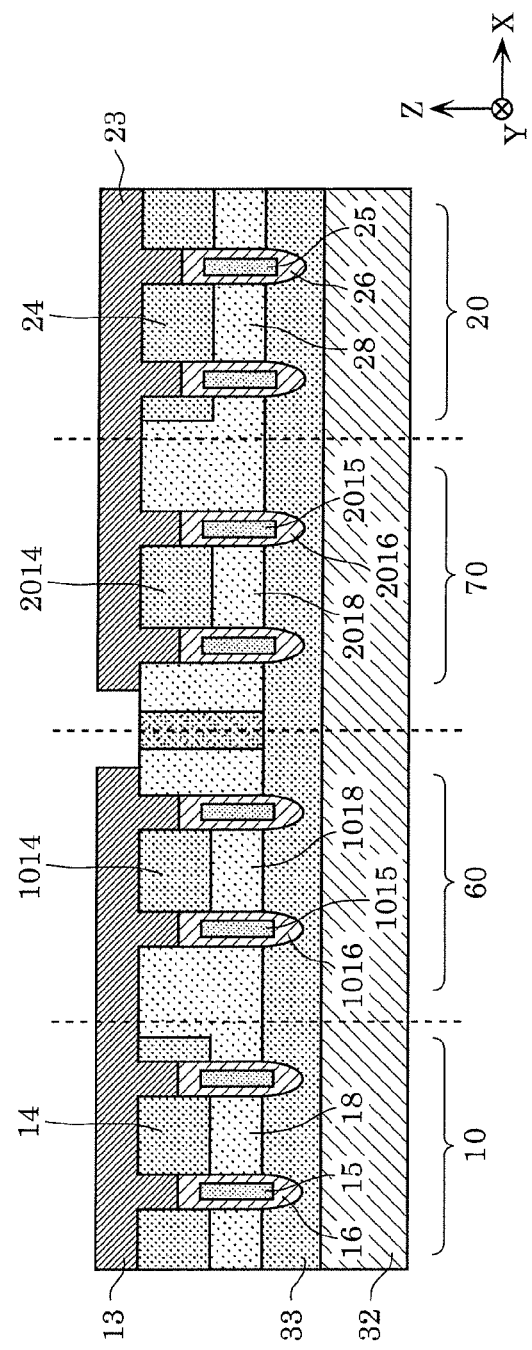
FIG. 12 is a cross-sectional view illustrating one example of the structure of the semiconductor device according to the embodiment.

FIG. 12 is a cross-sectional view illustrating one example of the structure of semiconductor device 1 having the aforementioned configuration. FIG. 12 illustrates a cross section taken along line A-A in FIG. 10.

As illustrated in FIG. 11 and FIG. 12, semiconductor device 1 having the aforementioned configuration includes transistor 60 for surge current diversion for transistor 10, which is formed in first region A1, and transistor 70 for surge current diversion for transistor 20, which is formed in second region A2. Each of transistor 60 and transistor 70 is disposed such that at least part of the transistor is disposed between first gate pad 119 and second gate pad 129, as illustrated in FIG. 10. The reasons will be described later.

As illustrated in FIG. 10 and FIG. 12, third body region 1018 containing impurity of the second conductivity type is formed in region 901 that belongs to first region A1. Third source region 1014 containing impurity of the first conductivity type, third gate conductor 1015, and third gate insulating film 1016 are formed in third body region 1018. Third gate conductor 1015 is electrically connected to section 13 of first source electrode 11. Moreover, fourth body region 2018 containing impurity of the second conductivity type is formed in region 902 that belongs to second region A2. Fourth source region 2014 containing impurity of the first conductivity type, fourth gate conductor 2015, and fourth gate insulating film 2016 are formed in fourth body region 2018. Fourth gate conductor 2015 is electrically connected to section 23 of second source electrode 21.

The above configurations of transistors 60 and 70 allow low-concentration impurity layer 33 and semiconductor substrate 32 to function as a common drain region serving as the first drain region of transistor 10, the second drain region of transistor 20, the third drain region of transistor 60, and the fourth drain region of transistor 70.

Figure 13:
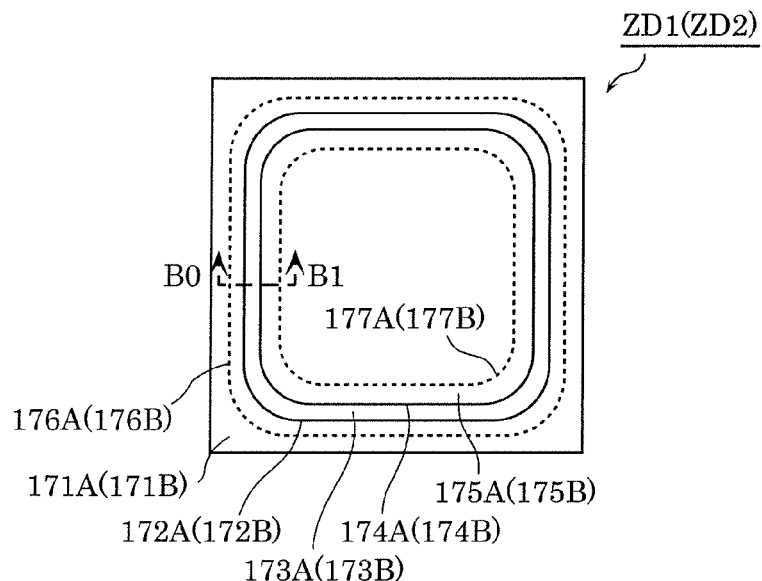
FIG. 13 is a top transparent view illustrating a bidirectional Zener diode according to the embodiment.
Figure 14:
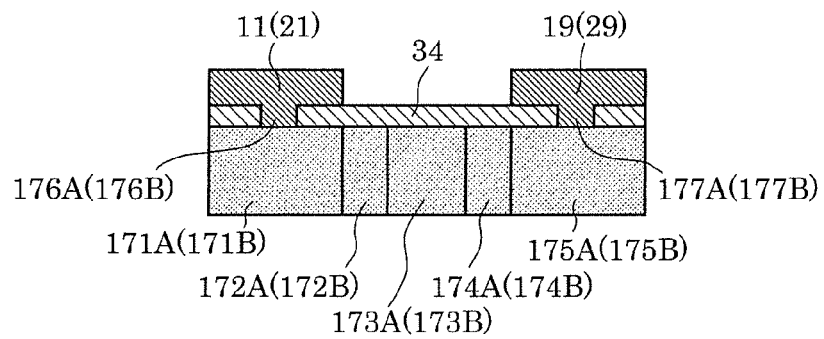
FIG. 14 is a cross-sectional view illustrating the bidirectional Zener diode according to the embodiment.

FIG. 13 is a top transparent view illustrating first bidirectional Zener diode ZD1 (second bidirectional Zener diode ZD2) and FIG. 14 is a cross-sectional view taken along plane B0-B1 illustrated in FIG. 13.

As illustrated in FIG. 13 and FIG. 14, first bidirectional Zener diode ZD1 includes layers aligned in a horizontal direction which are layers 171A, 173A, and 175A that are polysilicon layers of the first conductivity type and layers 172A and 174A that are polysilicon layers of the second conductivity type. Interlayer insulating layer 34 is formed on layers 171A through 175A, layer 171A is connected to first source electrode 11 via connector 176A, and layer 175A is connected to first gate electrode 19 via connector 177A, respectively, in contact with each other.

Second bidirectional Zener diode ZD2 has the same configuration as that of first bidirectional Zener diode ZD1 described above, layer 171B is connected to second source electrode 21 via connector 176B, and layer 175B is connected to second gate electrode 29 via connector 177B, respectively, in contact with each other.

The following describes transistor 60 and transistor 70. Transistor 60 and transistor 70, as compared with transistor 10 and transistor 20 which form a principal current channel, are each designed such that a parasitic bipolar transistor, which is naturally provided owing to the device structures of transistor 60 and transistor 70, easily turns on. Specifically, an occupied area ratio (in a plan view) between a source region and a body region that are alternately provided in a direction orthogonal to a direction in which a gate conductor extends are different between transistors 10, 20 and transistors 60, 70. By increasing a ratio at which the source region appears more than the body region in a specified width along the direction in which the gate conductor extends, it is possible to configure a transistor that allows a parasitic bipolar transistor to easily turn on. When the parasitic bipolar transistor easily turns on, a surge current easily flows through the parasitic bipolar transistor. Therefore, by proactively including a transistor that easily turns on, it is possible to control the channel of a surge current.

Figure 15:
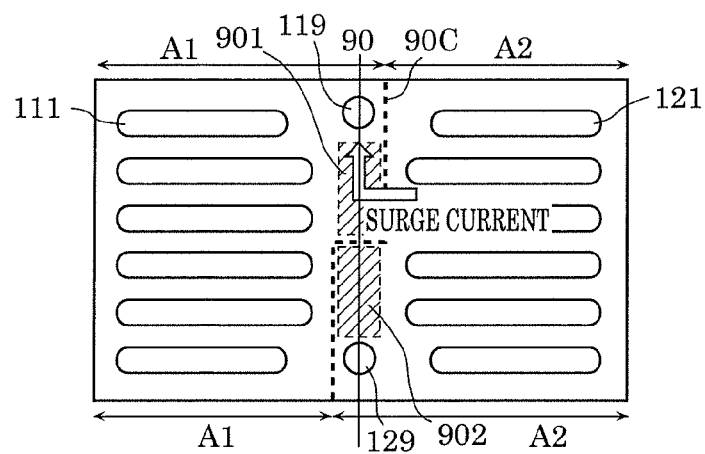
FIG. 15 schematically illustrates a typical channel of a surge current that flows through a semiconductor device according to the embodiment.

By providing, in region 901 that belongs to first region A1, transistor 60 with which a parasitic bipolar transistor easily turns on, when a surge current flows from second source pads 121 of transistor 20 to first region A1, the surge current firstly passes transistor 60 provided in the vicinity of boundary 90C before reaching transistor 10. Moreover, transistor 60, as compared with transistor 10, has a structure that allows even more the parasitic bipolar transistor to easily turn on. The surge current is therefore discharged through the parasitic bipolar transistor of transistor 60. Accordingly, there is a less risk that transistor 10, which forms a principal current channel, is destroyed due to the conduction of the surge current, and this can reduce the risk that the main functions of semiconductor device 1 are lost. FIG. 11 and FIG. 15 each illustrate a typical channel along which a surge current flows.

Similarly, by providing, in region 902 that belongs to second region A2, transistor 70 with which a parasitic bipolar transistor easily turns on, when a surge current flows from first source pads 111 of transistor 10 to second region A2, the surge current firstly passes transistor 70 provided in the vicinity of boundary 90C before reaching transistor 20. Moreover, transistor 70, as compared to transistor 20, has a structure that allows even more the parasitic bipolar transistor to easily turn on. The surge current is therefore discharged through the parasitic bipolar transistor of transistor 70. Accordingly, there is a less risk that transistor 20, which forms a principal current channel, is destroyed due to the conduction of the surge current, and this can reduce the risk that the main functions of semiconductor device 1 are lost.

Thus, with semiconductor device 1 having the aforementioned configuration, it is possible to prevent a surge current from flowing to transistor 10 and transistor 20, and this in turn makes it possible to enhance ESD tolerance.

In order to reduce conduction resistance, it is especially important to reduce on-resistance of semiconductor device 1. For, when an entire circuit at the time of current conduction is observed, semiconductor device 1 is a part where resistance is the largest in the circuit. In semiconductor device 1 at the time of current conduction, heat is also generated due to the amount of on-resistance. It is therefore also necessary to inhibit heat generation and effectively dissipate generated heat.

Large total areas of first source pads 111 and second source pads 121 are useful for the reduction of on-resistance and the enhancement of dissipation in semiconductor device 1. This is because when a solder contact area is large, a principal current channel is also large and it is possible to dissipate generated heat through solder. In view of this, it is effective to dispose at least one of the first source pads and at least one of the second source pads between the first gate pad and the second gate pad in the plan view of semiconductor device 1.

With such a configuration, it is possible to enlarge the total areas of first source pads 111 and second source pads 121 to the extent possible while disposing first gate pad 119 and second gate pad 129 at the side edge of a power line to avoid constituting obstacles to the conduction of current, and this in turn makes it possible to achieve on-resistance reduction and high dissipation.

In view of the principal current channel (see FIG. 2B) inside the device structure of semiconductor device 1, thinning of semiconductor layer 40 which is a resistive component of the principal current flowing in a vertical direction in FIG. 2B is raised as one of the means to reduce on-resistance of semiconductor device 1. Thickening of metal layer 30 which is a common drain electrode is also useful for reducing on-resistance. Namely, thinning of semiconductor layer 40 and thickening of metal layer 30 are effective in reducing on-resistance of semiconductor device 1. However, it is a known fact that when the thickness of semiconductor layer 40 gets closer to the thickness of metal layer 30, warpage of semiconductor device 1 that occurs at high temperature increases due to a difference, between a semiconductor and a metal, in physical property values such as coefficients of thermal expansion or Young's modulus.

Warpage of semiconductor device 1 mainly occurs in a high temperature environment when heat treatment is conducted at the temperature of around 250 degrees Celsius in reflow soldering. In flip-chip mounting, mounting is performed facedown causing metal layer 30 to face away from a printed wiring board. Since metal layer 30 expands more than semiconductor layer 40 when heated at a high temperature, warpage occurs forming a concave shape protruding in a direction away from the printed wiring board.

Figure 16:
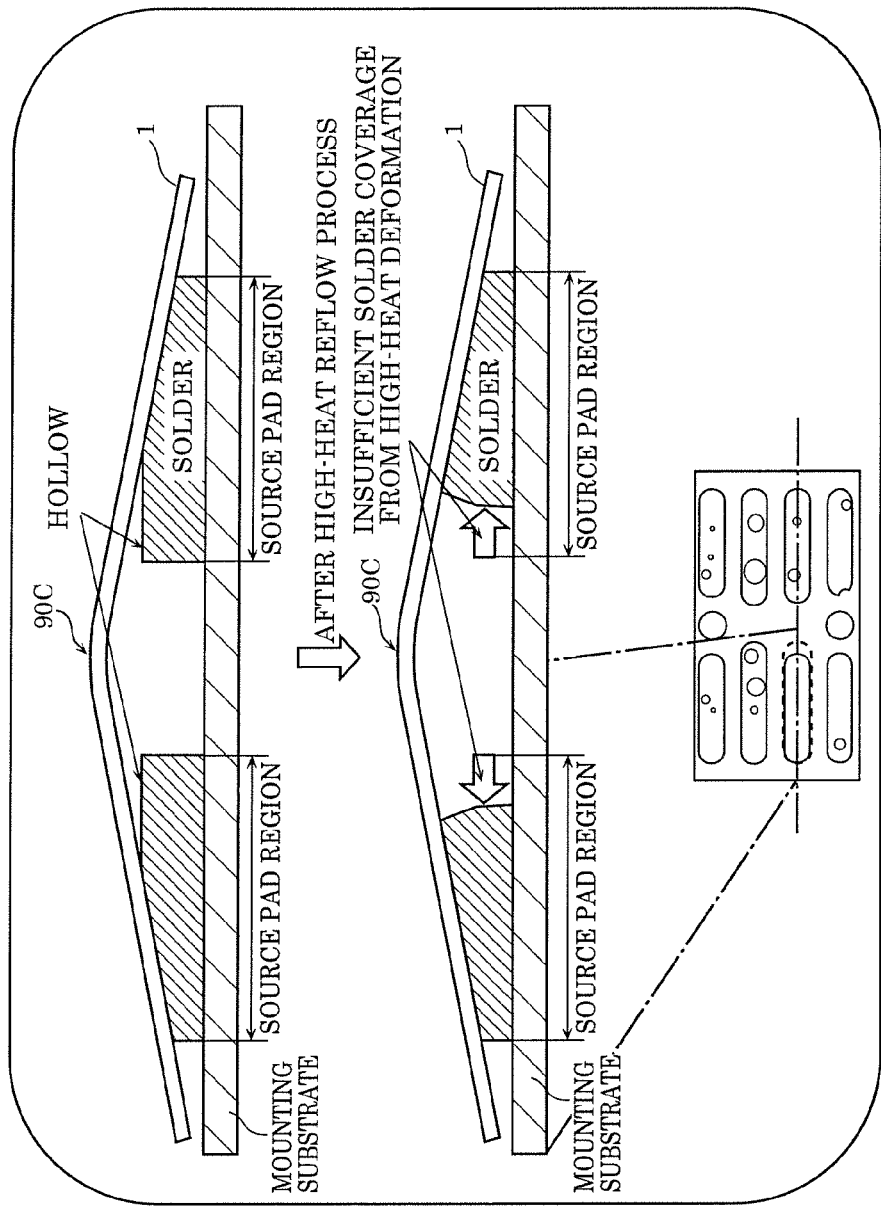
FIG. 16 is a cross-sectional view illustrating how a semiconductor device according to the embodiment warps.

Once semiconductor device 1 warps, this poses inconvenience when semiconductor device 1 is mounted, as illustrated in FIG. 16. Due to the shortage of solder near the center portion of semiconductor device 1 which is a concave portion, solder joint defects (insufficient solder coverage) may occur on one hand. On the other hand, a phenomenon that solder protrudes from a region in which the solder should stay (solder protrusion) is frequently observed in the outer periphery of semiconductor device 1 where a force by which semiconductor device 1 is pressed toward the printed wiring board increases due to the warpage.

It is possible to reduce mounting defects caused by the warpage of semiconductor device 1 having a device structure (thinning of semiconductor layer 40 and thickening of metal layer 30) to be pursued for on-resistance reduction, by appropriately arranging first source pads 111 and second source pads 121. As a result of conducting experiments and so forth with a single-minded dedication, the inventors have obtained the following results showing some improvements.

Figure 17:
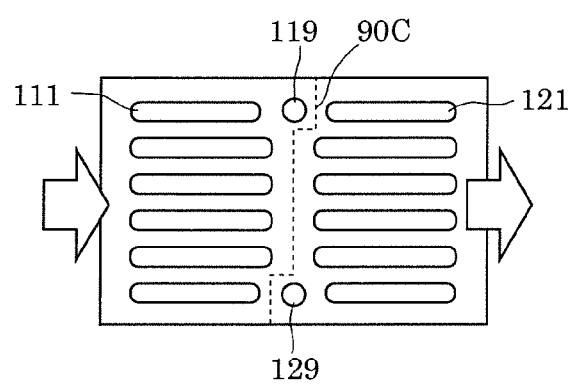
FIG. 17 is a schematic illustration of an example of an arrangement of electrode pads of a semiconductor device according to the embodiment.

As illustrated in FIG. 17, in the plan view of semiconductor device 1, the semiconductor layer may be a rectangle having longer sides in the first direction. Each of the first source pads and the second source pads may be approximately rectangular in shape, with the lengthwise direction of the source pad parallel to the first direction. The first source pads may be disposed in a stripe pattern and the second source pads may be disposed in a stripe pattern.

When semiconductor layer 40 is a rectangular having longer sides extending in the first direction, semiconductor device 1 warps in a direction parallel to the longer sides of semiconductor layer 40 when heated at a high temperature during reflow soldering. In a region closer to one shorter side of semiconductor layer 40 and a region closer to the other shorter side, as compared to the center portion of semiconductor device 1, solder is strongly pressed against the mounting substrate, as schematically illustrated in FIG. 16. However, when first source pads 111 and second source pads 121 having the aforementioned shapes are arranged as described above, the solders pressed in the regions near the two shorter sides of semiconductor layer 40 can flow toward the center portion (near boundary 90C) of semiconductor device 1 along the longer sides of semiconductor layer 40.

For this reason, with the arrangement of electrode pads as illustrated in FIG. 17, solder hardly protrudes from an area specified for an electrode pad even when the warpage of semiconductor device 1 is large.

Figure 18A:
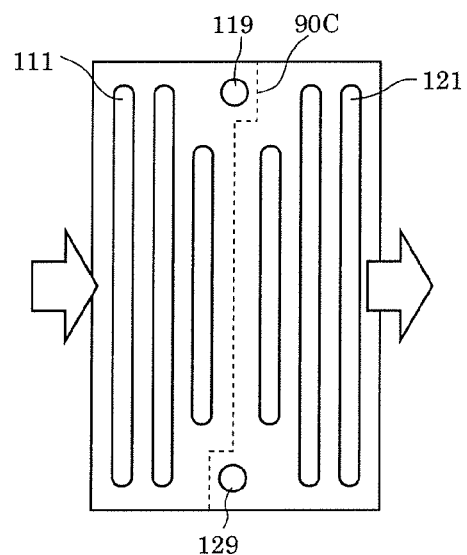
FIG. 18A is a schematic illustration of an example of an arrangement of electrode pads of a semiconductor device according to the embodiment.

As illustrated in FIG. 18A, in the plan view of semiconductor device 1, the semiconductor layer may be a rectangle having longer sides extending in the direction orthogonal to the first direction. Each of the first source pads and the second source pads may be approximately rectangular in shape, with the lengthwise direction of the source pad orthogonal to the first direction. The first source pads may be disposed in a stripe pattern and the second source pads may be disposed in a stripe pattern.

When semiconductor layer 40 is a rectangle having longer sides extending in the direction orthogonal to the first direction, semiconductor device 1 warps in a direction parallel to the longer sides of semiconductor layer 40 when heated at a high temperature during reflow soldering. With semiconductor device 1 having the aforementioned configuration, it is possible to reduce the influence the warpage of semiconductor device 1 has on mounting defects in the case where semiconductor layer 40 is a rectangle having longer sides extending in the direction orthogonal to the first direction. Since boundary 90C lies along the direction orthogonal to the first direction, any one of first source pads 111 and any one of second source pads 121 may be a long source pad extending along the longer sides of semiconductor layer 40 from the vicinity of one shorter side to the vicinity of the other shorter side to the extent such that the length of the long source pad is approximately as long as the longer sides of semiconductor layer 40.

Figure 18B:
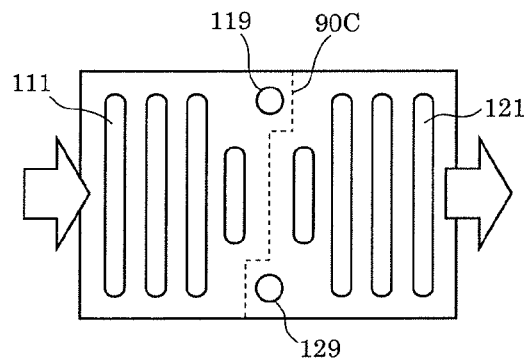
FIG. 18B is a schematic illustration of an example of the arrangement of electrode pads of the semiconductor device according to the embodiment.

As illustrated in FIG. 18B, in semiconductor device 1, the first vertical MOS transistor further includes a first source electrode disposed below the first source pads and connected to the first source pads, and the second vertical MOS transistor further includes a second source electrode disposed below the second source pads and connected to the second source pads. In the plan view: a side length in the first direction of the semiconductor layer is less than twice a side length in a direction orthogonal to the first direction; the first source electrode and the second source electrode are each approximately rectangular in shape; each of the first source pads and the second source pads is approximately rectangular in shape, with the lengthwise direction of the source pad parallel to the lengthwise direction of the first source electrode; the first source pads are disposed in a stripe pattern; and the second source pads are disposed in a stripe pattern.

Even when the length of a side, of semiconductor device 1, extending in the first direction is less than twice the length of a side extending in the direction orthogonal to the first direction, it is possible to reduce the influence of the warpage of semiconductor device 1, which occurs when semiconductor device 1 is heated at a high temperature during reflow soldering, has on mounting defects. The following describes the reasons with reference to FIG. 18C.

Figure 18C:
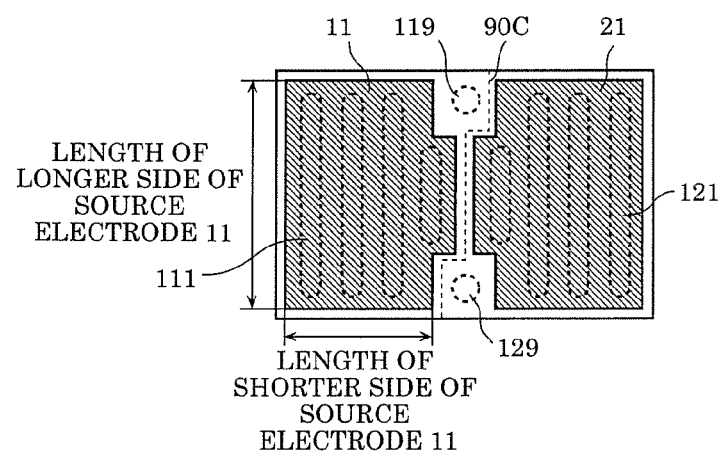
FIG. 18C is a schematic illustration of an example of the arrangement of source pads of the semiconductor device according to the embodiment.

FIG. 18C illustrates the arrangement of first source electrode 11 and second source electrode 21 provided in semiconductor device 1, in the plan view of semiconductor device 1. First source electrode 11 and second source electrode 21 occupy most of the areas of first region A1 and second region A2, respectively, and are each disposed in an approximately rectangular shape.

When the length of a side, of semiconductor device 1, extending in the first direction of semiconductor device 1 is less than twice the length of a side extending in the direction orthogonal to the first direction, the length of a side, of first source electrode 11, extending in the direction orthogonal to the first direction is greater than the length of a side extending in the first direction. In such a case, there is a risk that semiconductor layer 40 warps along the lengthwise direction of first source electrode 11. Therefore, by defining that each of first source pads 111 is approximately rectangular in shape, with the lengthwise direction of the source pad parallel to the lengthwise direction of first source electrode 11, and arranging first source pads 111 in a stripe pattern, it is possible to reduce mounting defects that occur when semiconductor layer 40 warps. Similarly, the length of a side, of second source electrode 21, extending in the direction orthogonal to the first direction is greater than the length of a side extending in the first direction. Therefore, by defining that each of second source pads 121 is approximately rectangular in shape, with the lengthwise direction of the source pad parallel to the lengthwise direction of second source electrode 21, and arranging second source pads 121 in a stripe pattern, it is possible to reduce mounting defects that occur when semiconductor layer 40 warps.

Figure 18D:
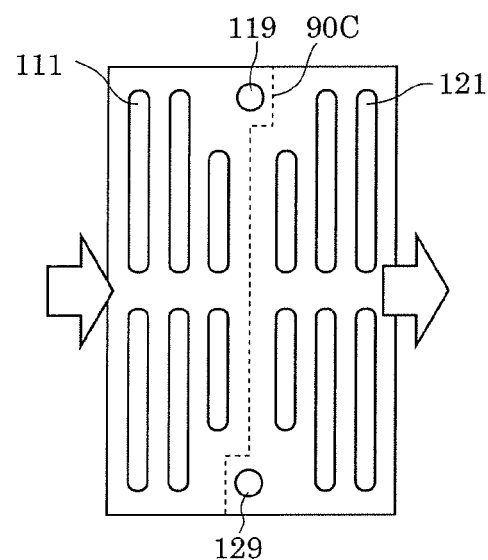
FIG. 18D is a schematic illustration of an example of the arrangement of electrode pads of the semiconductor device according to the embodiment.
Figure 18E:
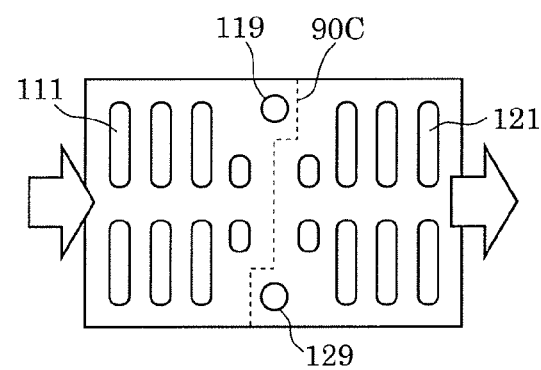
FIG. 18E is a schematic illustration of an example of the arrangement of electrode pads of the semiconductor device according to the embodiment.

Furthermore, according to semiconductor device 1, the first source pads are divided in two in a vicinity of a region that bisects the semiconductor layer in the direction orthogonal to the first direction, and the second source pads are divided in two in the vicinity of the region, as illustrated in FIG. 18D and FIG. 18E.

With semiconductor device 1 having the configuration illustrated in FIG. 18D, it is conceivable that solders strongly pressed against the printed wiring board in regions near the two shorter sides of semiconductor layer 40 flow toward a region, near the center of semiconductor device 1, in which no electrode pad is formed, and finally protrude. Since defects such as solder protrusion may be the cause of device dysfunction such as short-circuiting portions that should not be electrically connected, e.g., between first source pads 111 and second source pads 121, such defects should be prevented.

However, by disposing first source pads 111 and second source pads 121 such that the lengthwise direction of each of the source pads is parallel to the longer sides of semiconductor layer 40, nothing will affect device functions even when the source pads are electrically connected to each other due to solder protruding near the center portion of the longer sides of semiconductor layer 40.

With semiconductor device 1 having the configuration illustrated in FIG. 18E, it is conceivable that solders strongly pressed against the printed wiring board in regions close to the two shorter sides of first source electrode 11 and second source electrode 21 flow toward a region, near the center portions of the longer sides of first source electrode 11 and second source electrode 21, in which no electrode pad is formed, and finally protrude. Since defects such as solder protrusion may be the cause of device dysfunction such as short-circuiting portions that should not be electrically connected, e.g., between first source pads 111 and second source pads 121, such defects should be prevented.

However, by disposing first source pads 111 and second source pads 121 such that the lengthwise direction of each of the source pads is parallel to the longer sides of first source electrode 11 and second source electrode 21, nothing will affect device functions even when the source pads are electrically connected to each other due to solder protruding near the center portion of the longer sides of first source electrode 11 and second source electrode 21.

Note however that when the total areas of first source pads 111 and second source pads 121 get smaller, this may affect the on-resistance of semiconductor device 1.

Figure 19:
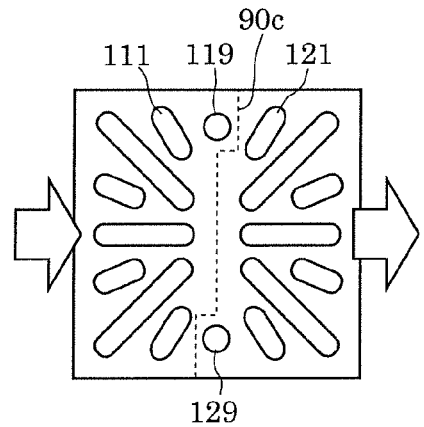
FIG. 19 is a schematic illustration of an example of an arrangement of electrode pads of a semiconductor device according to the embodiment.

Furthermore, in the plan view of semiconductor device 1, the semiconductor layer may be approximately square in shape, and each of the first source pads and the second source pads may be approximately rectangular in shape, with the lengthwise direction of the source pad radially extending from the center of the semiconductor layer, as illustrated in FIG. 19.

When semiconductor layer 40 is approximately square in shape, the warpage of semiconductor device 1 that occurs when semiconductor device 1 is heated at a high temperature during reflow soldering has a curved shape that is point-symmetric with respect to the center of semiconductor device 1 as a reference point. Since semiconductor layer 40 has neither shorter sides nor longer sides because of its square shape, semiconductor device 1 does not disproportionately warp in either way. In such a case, it is effective to dispose all the source pads such that the lengthwise direction of each of the source pads is a direction radially extending from the center of semiconductor device 1 as a reference point, in order to prevent mounting defects such as insufficient solder coverage and solder protrusion.

In recent years, there has been an active movement to provide wearable devices including smartphones and watches with waterproof functions. In response to such a movement, even for semiconductor device 1 used as part of a lithium-ion battery pack, injecting an under-filling material in a space between a mounting substrate and semiconductor device 1 and performing processing so that water does not come into the space are under consideration. A representative method, among others, to inject an under-filling material is to firstly perform mounting in a normal way and then inject an under-filling material in a space between the mounting substrate and semiconductor device 1.

A conceivable problem here is that when the space is small, the under-filling material does not permeate enough to reach a required level of filling due to a certain amount of adhesiveness in the under-filling material. To achieve the required level of permeation, consideration should be given not only to a difference in height between the mounting substrate and semiconductor device 1 (i.e., the height of solder, the amount of warpage of semiconductor device 1, etc.), but also to whether the under-filling material attempting to permeate sufficiently covers an entire region to be filled by the under-filling material while avoiding or going around solder which constitutes a two-dimensional obstacle.

When each of first source pads 111 and second source pads 121 is approximately oblong in shape having longer sides, as illustrated in FIG. 7A through FIG. 7D, FIG. 7F, FIG. 7G, FIG. 8A through FIG. 8D, and FIG. 9A, the under-filling material does not reach the utmost corners of a space and ends up with permeation at an insufficient level of filling. To address such a problem, it is effective to split first source pads 111 and second source pads 121 into smaller source pads to create many spaces so that the under-filling material easily permeates.

Figure 20A:
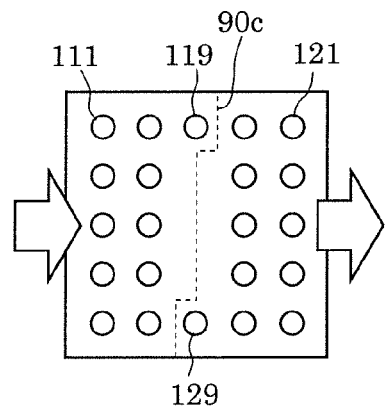
FIG. 20A is a schematic illustration of an example of the arrangement of electrode pads of the semiconductor device according to the embodiment.

In view of this, in the plan view of semiconductor device 1, the first source pads may be approximately circular in shape and may be disposed equidistantly in a matrix in which the first direction is a row direction and a direction orthogonal to the first direction is a column direction. The second source pads may be approximately circular in shape and may be disposed equidistantly in a matrix in which the first direction is a row direction and a direction orthogonal to the first direction is a column direction, as shown in FIG. 20A.

Such a configuration allows providing spaces in a regular manner between first source pads 111 and between second source pads 121, and this enables easy permeation of an under-filling material. Note, however, that since on-resistance depends upon the total area of the source pads, an excessive amount of spaces results in an unnecessary increase of on-resistance.

Figure 20B:
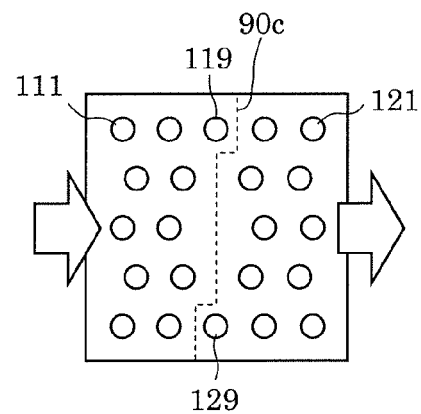
FIG. 20B is a schematic illustration of an example of the arrangement of electrode pads of the semiconductor device according to the embodiment.

In the plan view of semiconductor device 1, as shown in FIG. 20B, the first source pads may be approximately circular in shape and may be disposed equidistantly in a staggered arrangement in the first direction and a direction orthogonal to the first direction, the first direction being a row direction, the direction orthogonal to the first direction being a column direction. The second source pads may be approximately circular in shape and may be disposed equidistantly in a staggered arrangement in the first direction and a direction orthogonal to the first direction, the first direction being a row direction, the direction orthogonal to the first direction being a column direction.

The state in which the source pads are disposed equidistantly in a staggered arrangement means that the location of each of the source pads aligned in odd-numbered rows (or even-numbered rows) is staggered by half the length of a space provided when the source pads are disposed equidistantly in a matrix.

Such a configuration provides spaces in a regular manner between first source pads 111 and between second source pads 121, and this enables easy permeation of an under-filling material. Note, however, that since on-resistance depends upon the total area of the source pads, an excessive amount of spaces results in an unnecessary increase of on-resistance.

Although the semiconductor device according to one or more aspects of the present disclosure has been described based on an embodiment, the present disclosure is not limited to this embodiment. Those skilled in the art will readily appreciate that embodiments arrived at by making various modifications to the above embodiment or embodiments arrived at by selectively combining elements disclosed in the above embodiment without materially departing from the scope of the present disclosure may be included within one or more aspects of the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The semiconductor device according to the present disclosure can be used in various ways as a chip-size-package-type semiconductor device.

What is claimed is:

1. A semiconductor device which is a chip-size-package-type semiconductor device that is facedown mountable, the semiconductor device comprising:
   a semiconductor layer;
   a metal layer that is disposed in contact with a bottom surface of the semiconductor layer and has a thickness of at least 10 μm and at most 90 μm;

a first vertical metal oxide semiconductor (MOS) transistor disposed in a first region of the semiconductor layer; and
a second vertical MOS transistor disposed in a second region of the semiconductor layer, the second region being adjacent to the first region in a plan view of the semiconductor layer, wherein:
the first region and the second region are one and the other of two regions obtained by bisecting an area of the semiconductor layer,
components constituting the first vertical MOS transistor are included in the first region, and components constituting the second vertical MOS transistor are included in the second region,
in the plan view:
  the semiconductor layer includes the first vertical MOS transistor and the second vertical MOS transistor that are aligned in a first direction, and is a rectangle having longer sides extending in the first direction, and
  a boundary between the first region and the second region extends in a crank shape,
the semiconductor layer includes a semiconductor substrate,
the first vertical MOS transistor includes, on a surface of the semiconductor layer, first source pads and a first gate pad that are joined to a mounting substrate during facedown mounting, and the second vertical MOS transistor includes, on the surface of the semiconductor layer, second source pads and a second gate pad that are joined to the mounting substrate during facedown mounting,
the semiconductor substrate functions as a common drain region shared between the first vertical MOS transistor and the second vertical MOS transistor, and
in the plan view:
  a principal current flows in the first direction,
  the first gate pad is disposed such that none of the first source pads is disposed between the first gate pad and a first side that is parallel to the first direction and located closest to the first gate pad among four sides of the semiconductor layer, and none of the first source pads is disposed between the first gate pad and the boundary in the first direction,
  the second gate pad is disposed such that none of the second source pads is disposed between the second gate pad and a second side that is parallel to the first direction and located closest to the second gate pad among the four sides of the semiconductor layer, and none of the second source pads is disposed between the second gate pad and the boundary in the first direction,
  the second side is a side opposite the first side,
  the first gate pad and the second gate pad are each disposed on a central line that bisects the semiconductor layer and is orthogonal to the first direction,
  each of the first source pads and the second source pads is approximately rectangular or oblong in shape, with a lengthwise direction of the source pad parallel to the first direction, and
  the first source pads are disposed in a stripe pattern, and the second source pads are disposed in a stripe pattern.

2. The semiconductor device according to claim 1, wherein
in the plan view, when a space between the first gate pad and the first side in a direction orthogonal to the first direction is defined as a first space, a space between the first gate pad and the second side in the direction orthogonal to the first direction is defined as a second space, a space between the second gate pad and the first side in the direction orthogonal to the first direction is defined as a third space, and a space between the second gate pad and the second side in the direction orthogonal to the first direction is defined as a fourth space, the first space is different from the second space and the third space is different from the fourth space.

3. A semiconductor device which is a chip-size-package-type semiconductor device that is facedown mountable, the semiconductor device comprising:
a semiconductor layer;
a metal layer that is disposed in contact with a bottom surface of the semiconductor layer;
a first vertical metal oxide semiconductor (MOS) transistor disposed in a first region of the semiconductor layer; and
a second vertical MOS transistor disposed in a second region of the semiconductor layer, the second region being adjacent to the first region in a plan view of the semiconductor layer, wherein:
the first region and the second region are one and the other of two regions obtained by bisecting an area of the semiconductor layer,
components constituting the first vertical MOS transistor are included in the first region, and components constituting the second vertical MOS transistor are included in the second region,
in the plan view:
  the semiconductor layer includes the first vertical MOS transistor and the second vertical MOS transistor that are aligned in a first direction, and is a rectangle having longer sides extending in the first direction, and
  a boundary between the first region and the second region extends in a crank shape,
the semiconductor layer includes a semiconductor substrate,
the first vertical MOS transistor includes, on a surface of the semiconductor layer, first source pads and a first gate pad that are joined to a mounting substrate during facedown mounting, and the second vertical MOS transistor includes, on the surface of the semiconductor layer, second source pads and a second gate pad that are joined to the mounting substrate during facedown mounting,
the semiconductor substrate functions as a common drain region shared between the first vertical MOS transistor and the second vertical MOS transistor, and
in the plan view:
  a principal current flows in the first direction,
  the first gate pad is disposed such that none of the first source pads is disposed between the first gate pad and a first side that is parallel to the first direction and located closest to the first gate pad among four sides of the semiconductor layer, and none of the first source pads is disposed between the first gate pad and the boundary in the first direction,
  the second gate pad is disposed such that none of the second source pads is disposed between the second gate pad and a second side that is parallel to the first direction and located closest to the second gate pad among the four sides of the semiconductor layer, and none of the second source pads is disposed between the second gate pad and the boundary in the first direction, the second side is a side opposite the first side, the first gate pad and the second gate pad are each disposed on a central line that bisects the semiconductor layer and is orthogonal to the first direction, each of the first source pads and the second source pads is approximately rectangular or oblong in shape, with a lengthwise direction of the source pad parallel to the first direction, the first source pads are disposed in a stripe pattern, and the second source pads are disposed in a stripe pattern, at least any one of the first source pads and at least any one of the second source pads are disposed in a stripe-shaped region extending in the first direction and being sandwiched between the first gate pad and the second gate pad in a direction orthogonal to the first direction, and the first gate pad and the second gate pad are not disposed in the stripe-shaped region.

4. The semiconductor device according to claim 3, wherein
in the plan view, when a space between the first gate pad and the first side in the direction orthogonal to the first direction is defined as a first space, a space between the first gate pad and the second side in the direction orthogonal to the first direction is defined as a second space, a space between the second gate pad and the first side in the direction orthogonal to the first direction is defined as a third space, and a space between the second gate pad and the second side in the direction orthogonal to the first direction is defined as a fourth space, the first space is different from the second space and the third space is different from the fourth space.

5. A semiconductor device which is a chip-size-package-type semiconductor device that is facedown mountable, the semiconductor device comprising:
a semiconductor layer;
a metal layer that is disposed in contact with a bottom surface of the semiconductor layer and has a thickness of at least 10 μm and at most 90 μm;
a first vertical metal oxide semiconductor (MOS) transistor disposed in a first region of the semiconductor layer; and
a second vertical MOS transistor disposed in a second region of the semiconductor layer, the second region being adjacent to the first region in a plan view of the semiconductor layer, wherein:
the first region and the second region are one and the other of two regions obtained by bisecting an area of the semiconductor layer,
components constituting the first vertical MOS transistor are included in the first region, and components constituting the second vertical MOS transistor are included in the second region,
in the plan view:
the semiconductor layer includes the first vertical MOS transistor and the second vertical MOS transistor that are aligned in a first direction, and a length of a side of the semiconductor layer in the first direction is less than a length of a side of the semiconductor layer in a direction orthogonal to the first direction, and
a boundary between the first region and the second region extends in a crank shape, the semiconductor layer includes a semiconductor substrate, the first vertical MOS transistor includes, on a surface of the semiconductor layer, first source pads and a first gate pad that are joined to a mounting substrate during facedown mounting, and the second vertical MOS transistor includes, on the surface of the semiconductor layer, second source pads and a second gate pad that are joined to the mounting substrate during facedown mounting, the semiconductor substrate functions as a common drain region shared between the first vertical MOS transistor and the second vertical MOS transistor, and in the plan view:
a principal current flows in the first direction,
the first gate pad is disposed such that none of the first source pads is disposed between the first gate pad and a first side that is parallel to the first direction and located closest to the first gate pad among four sides of the semiconductor layer, and none of the first source pads is disposed between the first gate pad and the boundary in the first direction, the second gate pad is disposed such that none of the second source pads is disposed between the second gate pad and a second side that is parallel to the first direction and located closest to the second gate pad among the four sides of the semiconductor layer, and none of the second source pads is disposed between the second gate pad and the boundary in the first direction, the second side is a side opposite the first side, the first gate pad and the second gate pad are each disposed on a central line that bisects the semiconductor layer and is orthogonal to the first direction, the first vertical MOS transistor includes a first source electrode disposed below the first source pads and connected to the first source pads, the second vertical MOS transistor includes a second source electrode disposed below the second source pads and connected to the second source pads, each of the first source pads and the second source pads is approximately rectangular or oblong in shape, with a lengthwise direction of the source pad parallel to the direction orthogonal to the first direction, and the first source pads are disposed in a stripe pattern, and the second source pads are disposed in a stripe pattern.

6. The semiconductor device according to claim 5, wherein
the first source pads are divided in two by a region that bisects the semiconductor layer in the direction orthogonal to the first direction, and the second source pads are divided in two by the region.

7. The semiconductor device according to claim 5, wherein
in the plan view, when a space between the first gate pad and the first side in the direction orthogonal to the first direction is defined as a first space, a space between the first gate pad and the second side in the direction orthogonal to the first direction is defined as a second space, a space between the second gate pad and the first side in the direction orthogonal to the first direction is defined as a third space, and a space between the second gate pad and the second side in the direction orthogonal to the first direction is defined as a fourth space, the first space is different from the second space and the third space is different from the fourth space.

8. A semiconductor device which is a chip-size-package-type semiconductor device that is facedown mountable, the semiconductor device comprising:
- a semiconductor layer;
- a metal layer that is disposed in contact with a bottom surface of the semiconductor layer;
- a first vertical metal oxide semiconductor (MOS) transistor disposed in a first region of the semiconductor layer; and
- a second vertical MOS transistor disposed in a second region of the semiconductor layer, the second region being adjacent to the first region in a plan view of the semiconductor layer, wherein:

the first region and the second region are one and the other of two regions obtained by bisecting an area of the semiconductor layer, components constituting the first vertical MOS transistor are included in the first region, and components constituting the second vertical MOS transistor are included in the second region, in the plan view:
- the semiconductor layer includes the first vertical MOS transistor and the second vertical MOS transistor that are aligned in a first direction, and a length of a side of the semiconductor layer in the first direction is less than a length of a side of the semiconductor layer in a direction orthogonal to the first direction, and
- a boundary between the first region and the second region extends in a crank shape, the semiconductor layer includes a semiconductor substrate, the first vertical MOS transistor includes, on a surface of the semiconductor layer, first source pads and a first gate pad that are joined to a mounting substrate during facedown mounting, and the second vertical MOS transistor includes, on the surface of the semiconductor layer, second source pads and a second gate pad that are joined to the mounting substrate during facedown mounting, the semiconductor substrate functions as a common drain region shared between the first vertical MOS transistor and the second vertical MOS transistor, and in the plan view:
- a principal current flows in the first direction,
- the first gate pad is disposed such that none of the first source pads is disposed between the first gate pad and a first side that is parallel to the first direction and located closest to the first gate pad among four sides of the semiconductor layer, and none of the first source pads is disposed between the first gate pad and the boundary in the first direction,
- the second gate pad is disposed such that none of the second source pads is disposed between the second gate pad and a second side that is parallel to the first direction and located closest to the second gate pad among the four sides of the semiconductor layer, and none of the second source pads is disposed between the second gate pad and the boundary in the first direction,
- the second side is a side opposite the first side,
- the first gate pad and the second gate pad are each disposed on a central line that bisects the semiconductor layer and is orthogonal to the first direction,
- the first vertical MOS transistor includes a first source electrode disposed below the first source pads and connected to the first source pads,
- the second vertical MOS transistor includes a second source electrode disposed below the second source pads and connected to the second source pads,
- each of the first source pads and the second source pads is approximately rectangular or oblong in shape, with a lengthwise direction of the source pad parallel to the direction orthogonal to the first direction, and
- the first source pads are disposed in a stripe pattern, and the second source pads are disposed in a stripe pattern,
- at least any one of the first source pads and at least any one of the second source pads are disposed in a stripe-shaped region extending in the first direction and being sandwiched between the first gate pad and the second gate pad in the direction orthogonal to the first direction, and
- the first gate pad and the second gate pad are not disposed in the stripe-shaped region.

9. The semiconductor device according to claim 8, wherein
the first source pads are divided in two by a region that bisects the semiconductor layer in the direction orthogonal to the first direction, and the second source pads are divided in two by the region.

10. The semiconductor device according to claim 8, wherein
in the plan view, when a space between the first gate pad and the first side in the direction orthogonal to the first direction is defined as a first space, a space between the first gate pad and the second side in the direction orthogonal to the first direction is defined as a second space, a space between the second gate pad and the first side in the direction orthogonal to the first direction is defined as a third space, and a space between the second gate pad and the second side in the direction orthogonal to the first direction is defined as a fourth space, the first space is different from the second space and the third space is different from the fourth space.

* * * * *